US012772654B2

(12) United States Patent
Ueta

(10) Patent No.: US 12,772,654 B2
(45) Date of Patent: Oct. 20, 2026

(54) LIGHTING EMITTING LAYER WITH A QUANTUM DOT HAVING CORE AND SHELL CONTAINING HALOGEN ELEMENTS

(71) Applicant: Sharp Display Technology Corporation, Kameyama City (JP)

(72) Inventor: Yoshihiro Ueta, Kameyama City (JP)

(73) Assignee: Sharp Display Technology Corporation, Kameyama City (JP)

( * ) Notice: Subject to any disclaimer, the term of this patent is extended or adjusted under 35 U.S.C. 154(b) by 411 days.

(21) Appl. No.: 18/686,435

(22) PCT Filed: Oct. 25, 2021

(86) PCT No.: PCT/JP2021/039359

§ 371 (c)(1),
(2) Date: Feb. 26, 2024

(87) PCT Pub. No.: WO2023/073783

PCT Pub. Date: May 4, 2023

(65) Prior Publication Data

US 2024/0373660 A1 Nov. 7, 2024

(51) Int. Cl.
*H10K 50/115* (2023.01)
*C09K 11/02* (2006.01)
(Continued)

(52) U.S. Cl.
CPC ............ *H10K 50/115* (2023.02); *C09K 11/02* (2013.01); *C09K 11/0827* (2013.01);
(Continued)

(58) Field of Classification Search
CPC .... H10K 50/115; H10K 50/181; H10K 50/15; H10K 50/16; C09K 11/02; C09K 11/0827
See application file for complete search history.

(56) References Cited

U.S. PATENT DOCUMENTS 10,396,306 B2 * 8/2019 Kim ..................... G09G 3/3208
2003/0066998 A1 * 4/2003 Lee ........................ B82Y 10/00
257/E29.082
(Continued)

FOREIGN PATENT DOCUMENTS

JP 2004-303592 A 10/2004
JP 2011-026472 A 2/2011
(Continued)

*Primary Examiner* — Alonzo Chambliss
(74) *Attorney, Agent, or Firm* — ScienBiziP, P.C.

(57) ABSTRACT

A light-emitting element includes the following: a first electrode and a second electrode; a light-emitting layer disposed between the first electrode and the second electrode; and a functional layer disposed between the light-emitting layer and the second electrode, wherein the light-emitting layer has a first quantum dot portion including a first quantum dot, and a second quantum dot portion including a second quantum dot, and disposed between the first quantum dot portion and the functional layer, and one of the first quantum dot portion and the second quantum dot portion contains halogen elements at a predetermined concentration, and the other of the first quantum dot portion and the second quantum dot portion contains no halogen elements or contains halogen elements at a lower concentration than the predetermined concentration.

20 Claims, 20 Drawing Sheets

(51) Int. Cl.

| | |
|---|---|
| ***C09K 11/08*** | (2006.01) |
| ***H10K 50/15*** | (2023.01) |
| ***H10K 50/16*** | (2023.01) |
| ***H10K 50/18*** | (2023.01) |
| *H10K 59/35* | (2023.01) |
| *H10K 101/30* | (2023.01) |
| *H10K 101/40* | (2023.01) |
| *H10K 102/00* | (2023.01) |

(52) U.S. Cl.

CPC ............. *H10K 50/15* (2023.02); *H10K 50/16* (2023.02); *H10K 50/181* (2023.02); *C09K 2211/10* (2013.01); *H10K 59/35* (2023.02); *H10K 2101/30* (2023.02); *H10K 2101/40* (2023.02); *H10K 2102/351* (2023.02)

(56) References Cited

U.S. PATENT DOCUMENTS

| | | | |
|---|---|---|---|
| 2011/0017951 | A1 | 1/2011 | Ryowa |
| 2011/0057178 | A1 | 3/2011 | Shitagaki et al. |
| 2011/0084250 | A1 | 4/2011 | Jang et al. |
| 2013/0069044 | A1 | 3/2013 | Ma |
| 2015/0179966 | A1 | 6/2015 | Ma |
| 2016/0225947 | A1 | 8/2016 | Murayama et al. |
| 2016/0233449 | A1 | 8/2016 | Murayama et al. |
| 2018/0138434 | A1 | 5/2018 | Yoon et al. |
| 2019/0326539 | A1* | 10/2019 | Chung ................. H10H 20/812 |
| 2020/0299575 | A1 | 9/2020 | Ippen et al. |
| 2020/0313108 | A1 | 10/2020 | Jang et al. |
| 2021/0135139 | A1* | 5/2021 | Lee ........................ H10K 50/13 |
| 2022/0115617 | A1 | 4/2022 | Jang et al. |

FOREIGN PATENT DOCUMENTS

| | | | |
|---|---|---|---|
| JP | 2011-077032 | A | 4/2011 |
| JP | 2011-080067 | A | 4/2011 |
| JP | 2013-519209 | A | 5/2013 |
| JP | 2020-161476 | A | 10/2020 |
| JP | 2020-180278 | A | 11/2020 |
| WO | 2015/056749 | A1 | 4/2015 |
| WO | 2015/056750 | A1 | 4/2015 |

* cited by examiner

LIGHTING EMITTING LAYER WITH A QUANTUM DOT HAVING CORE AND SHELL CONTAINING HALOGEN ELEMENTS

TECHNICAL FIELD

The disclosure relates to a light-emitting element and other things.

BACKGROUND ART

Patent Literature 1 discloses a method for adding fluoride anions onto a quantum dot surface.

CITATION LIST

Patent Literature

Patent Literature 1: Japanese Unexamined Patent Application Publication (Translation of PCT application) No. 2020-180278

SUMMARY

Technical Problem

The problem is enhancing the light emission efficiency of a light-emitting element containing quantum dots.

Solution to Problem

A light-emitting element according to one aspect of the disclosure includes the following: a first electrode and a second electrode; a light-emitting layer disposed between the first electrode and the second electrode; and a functional layer disposed between the light-emitting layer and the second electrode, wherein the light-emitting layer has a first quantum dot portion including a first quantum dot, and a second quantum dot portion disposed between the first quantum dot portion and the functional layer, and including a second quantum dot, and one of the first quantum dot portion and the second quantum dot portion contains halogen elements at a predetermined concentration, and the other of the first quantum dot portion and the second quantum dot portion contains no halogen elements or contains halogen elements at a lower concentration than the predetermined concentration.

Advantageous Effect of Disclosure

The aspect of the disclosure can enhance the light emission efficiency of a light-emitting element.

DESCRIPTION OF EMBODIMENTS

First Embodiment

Figure 1:
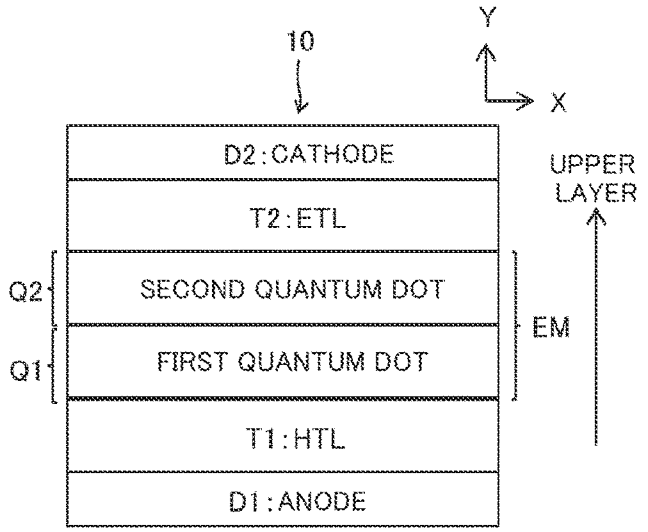
FIG. 1 is a schematically illustrates an example configuration of a light-emitting element according to a first embodiment.

FIG. 1 schematically illustrates an example configuration of a light-emitting element according to a first embodiment. A light-emitting element 10 according to the first embodiment includes the following: a first electrode D1 and a second electrode D2; a light-emitting layer (active layer)

EM disposed between the first electrode D1 and the second electrode D2; a functional layer T1 disposed between the first electrode D1 and the light-emitting layer EM; and a functional layer T2 disposed between the light-emitting layer EM and the second electrode D2. The surface direction of the first electrode D1 and second electrode D2 will be defined as an x-direction, and a direction perpendicular to the x-direction will be defined as a y-direction (layer thickness direction)

The second electrode D2 is located over the first electrode D1. That is, the second electrode D2 is formed in a process step that is posterior to a process step of forming the first electrode D1. For instance, the second electrode D2 is disposed further away in the y-direction from a pixel circuit board (described later on) including thin-film transistors than the first electrode D1.

The first electrode D1 may be an anode, the second electrode D2 may be a cathode, the functional layer T1 may be a hole transport layer (HTL), and the functional layer T2 may be an electron transport layer (ETL). A hole injection layer may be provided between the anode (D1) and the hole transport layer (T1), and an electron injection layer may be provided between the cathode (D2) and the electron transport layer (T2).

The light-emitting layer EM has the following: a first quantum dot portion Q1 including a first quantum dot QF; and a second quantum dot portion Q2 including a second quantum dot QS, and disposed between the first quantum dot portion Q1 and the functional layer T2 (ETL). One of the first quantum dot portion Q1 and second quantum dot portion Q2 contains halogen element at a predetermined concentration, and the other contains no halogen elements or contains halogen elements at a lower concentration than the predetermined concentration. The predetermined concentration may be a concentration that is selected freely from, for instance, a range of $10^{15}$ elements/$cm^3$ to $10^{23}$ elements/$cm^3$. For instance, when the first quantum dot portion Q1 contains halogen elements at a concentration of $10^{18}$ elements/$cm^3$, the second quantum dot portion Q2 may contain no halogen elements or may contain halogen elements at a lower concentration than $10^{18}$ elements/$cm^3$. The first quantum dot portion Q1 may contain halogen elements at a predetermined concentration, and the first quantum dot portion Q1 may be disposed closer to the anode (e.g., D1) than the second quantum dot portion Q2. It is noted that the anode may be located under the cathode (forward structure), or over the cathode (reverse structure).

The first quantum dot portion Q1 and the second quantum dot portion Q2 do not necessarily have to be stacked in contact; they exhibit a similar effect (within a scope where the description of the effect does not contradict) even though another layer is interposed between them. For instance, a third quantum dot portion may be disposed between the first quantum dot portion Q1 and the second quantum dot portion Q2, and the third quantum dot portion may have a halogen element concentration falling between the halogen element concentration of the first quantum dot portion Q1 and the halogen element concentration of the second quantum dot portion Q2 (a concentration value greater than one and smaller than the other).

The first quantum dot portion Q1 and the second quantum dot portion Q2 do not also necessarily have to be formed in the form of a layer or a film, or formed with a uniform film thickness; they may be formed in the form of an island, or a shape having recesses and protrusions; they exhibit a similar effect (within a scope where the description of the effect does not contradict) in at least a location where the first quantum dot portion Q1 or second quantum dot portion Q2 is formed. Nevertheless, the first quantum dot portion and the second quantum dot portion Q2 are desirably formed in the form of a layer or a film, because they exhibit the effect of the present disclosure within a wide range where they face each other in the form of a layer or a film. The first quantum dot portion Q1 and the second quantum dot portion Q2 are also further desirably formed with a uniform film thickness, because the degree of the effect is equal at locations having a uniform film thickness.

Figure 2:
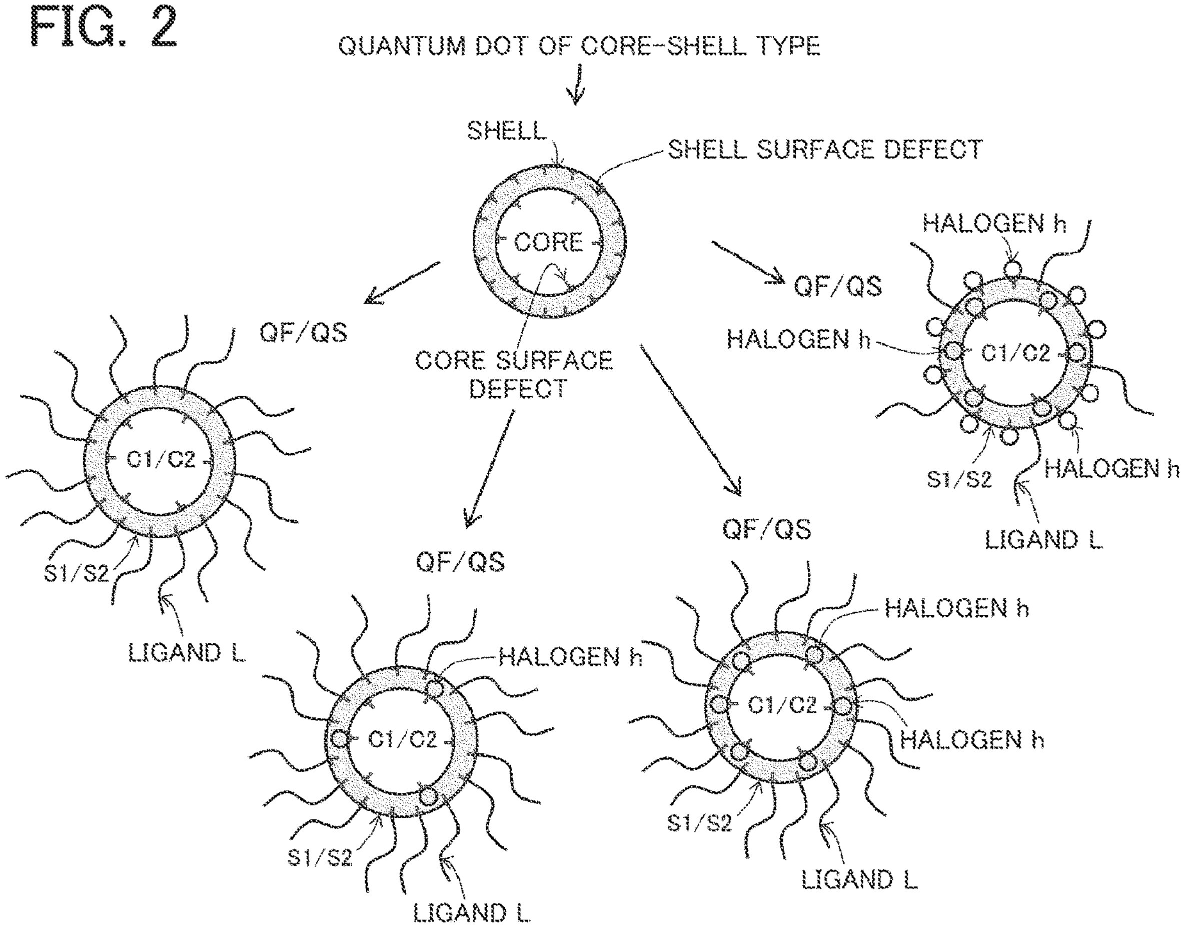
FIG. 2 schematically illustrates an example configuration of a first quantum dot and of a second quantum dot.

FIG. 2 schematically illustrates an example configuration of the first quantum dot and second quantum dot. A quantum dot of a core-shell type includes a core, and a shell formed in at least part of the core's surface. The shell may cover the entire core.

As illustrated in FIG. 2, the first quantum dot QF may include a core C1, a shell S1, and ligands L, and at least one of the core C1 and shell S1 may contain halogen elements h. The halogen elements h may be fluorine (F), or any one of chlorine (Cl), bromine (Br) and iodine (I). The halogen elements h may make surface defects k of the core C1 or shell S1 inert, or the ligands L may make the surface defects k of the shell S1 inert. A surface defect that is not deactivated can be a non-light-emitting center or a carrier trap. The halogen elements h make the surface defects k inert as a consequence of obtaining the electrons of the surface defects k to stabilize.

The second quantum dot QS may include a core C2, a shell S2, and ligands L, and at least one of the core C2 and shell S2 may contain halogen elements h. The halogen elements h may be fluorine (F), or any one of chlorine (Cl), bromine (Br) and iodine (I). The halogen elements h may make surface defects k of the core C2 or shell S2 inert, or the ligands L may make the surface defects k of the shell S2 inert.

The first quantum dot QF and the second quantum dot QS can be a semiconductor nanoparticle. The semiconductor nanoparticle is a particle having a maximum width of 100 nm or less. The semiconductor nanoparticle needs to have a non-limiting shape that satisfies this maximum width; the shape is not limited to a spherical cubic shape (a circular sectional shape). For instance, a polygonal sectional shape, a bar-shaped solid shape, a branch-shaped solid shape, a solid shape having surface asperities, or a combination of them. The semiconductor nanoparticle includes a semiconductor. The semiconductor herein means a material that has a predetermined band gap, and that can emit light, and the semiconductor includes at least the following materials. The semiconductor herein includes at least one selected from the group consisting of, for instance, a group II-VI compound, a group III-V compound, a chalcogenide, and a perovskite compound. It is noted that the group II-VI compound means a compound containing a group II element and a group VI element, and that the group III-V compound means a compound containing a group III element and a group V element. It is also noted that the group II element can include a group 2 element and a group 12 element, that the group III element can include a group 3 element and a group 13 element, that the group V element can include a group 5 element and a group 15 element, and that the group VI element can include a group 6 element and a group 16 element. It is noted that the numeral notation of an element's group using a Roman number is based on the former IUPAC system or the former CAS system, and that the numeral notation of an element's group using an Arabic number is based on the current IUPAC system. It is also noted that the group II-VI compound contains at least one selected from the group consisting of, for instance, MgS, MgSe, MgTe, CaS, CaSe, CaTe, SrS, SrSe, SrTe, BaS, BaSe, BaTe, ZnS, ZnSe, ZnTe, CdS, CdSe, CdTe, HgS, HgSe, and HgTe. It is also noted that the group III-V compound contains at least one selected from the group consisting of, for instance, GaAs, GaP, InN, InAs, InP, and InSb. It is also noted that the chalcogenide is a compound containing a group VIA (16) element and contains, for instance, CdS or CdSe. The chalcogenide may contain a mixed crystal of them. It is also noted that the perovskite compound has, for instance, composition expressed by a general formula CsPbX3. The constituent element X includes at least one selected from the group consisting of Cl, Br, and I. A semiconductor nanocrystal particle may emit light, as electroluminescence, having a wavelength corresponding to a band gap. The band gap varies in accordance with the particle diameter and composition of the semiconductor nanocrystal particle. The particle diameter of the semiconductor nanocrystal particle may be, for instance, 0.5 to 100 [nm] and 1.0 to 10 [nm]. The shape of the semiconductor nanocrystal particle is not limited to a spherical shape; for instance, the shape may be an elliptic spherical shape, a polyhedron shape, a rod shape, a branch solid shape, a solid shape having surface asperities, or a shape with a combination of these solids.

The semiconductor nanocrystal particle may contain a semiconductor material composed of at least one element selected from the group of, for instance, cadmium (Cd), sulfur (S), tellurium (Te), selenium (Se), zinc (Zn), indium (In), nitrogen (N), phosphorus (P), arsenic (As), antimony (Sb), aluminum (Al), gallium (Ga), lead (Pb), silicon (Si), germanium (Ge), and magnesium (Mg). Specific examples of the semiconductor material include cadmium selenide (CdSe), indium phosphide (InP), and zinc selenide (ZnSe). The first quantum dot QF and the second quantum dot QS may be composed of an identical material or different materials. The first quantum dot QF and the second quantum dot QS may be a core-shell type, or a shell-less type with its core exposed.

Example 1

Figure 3:
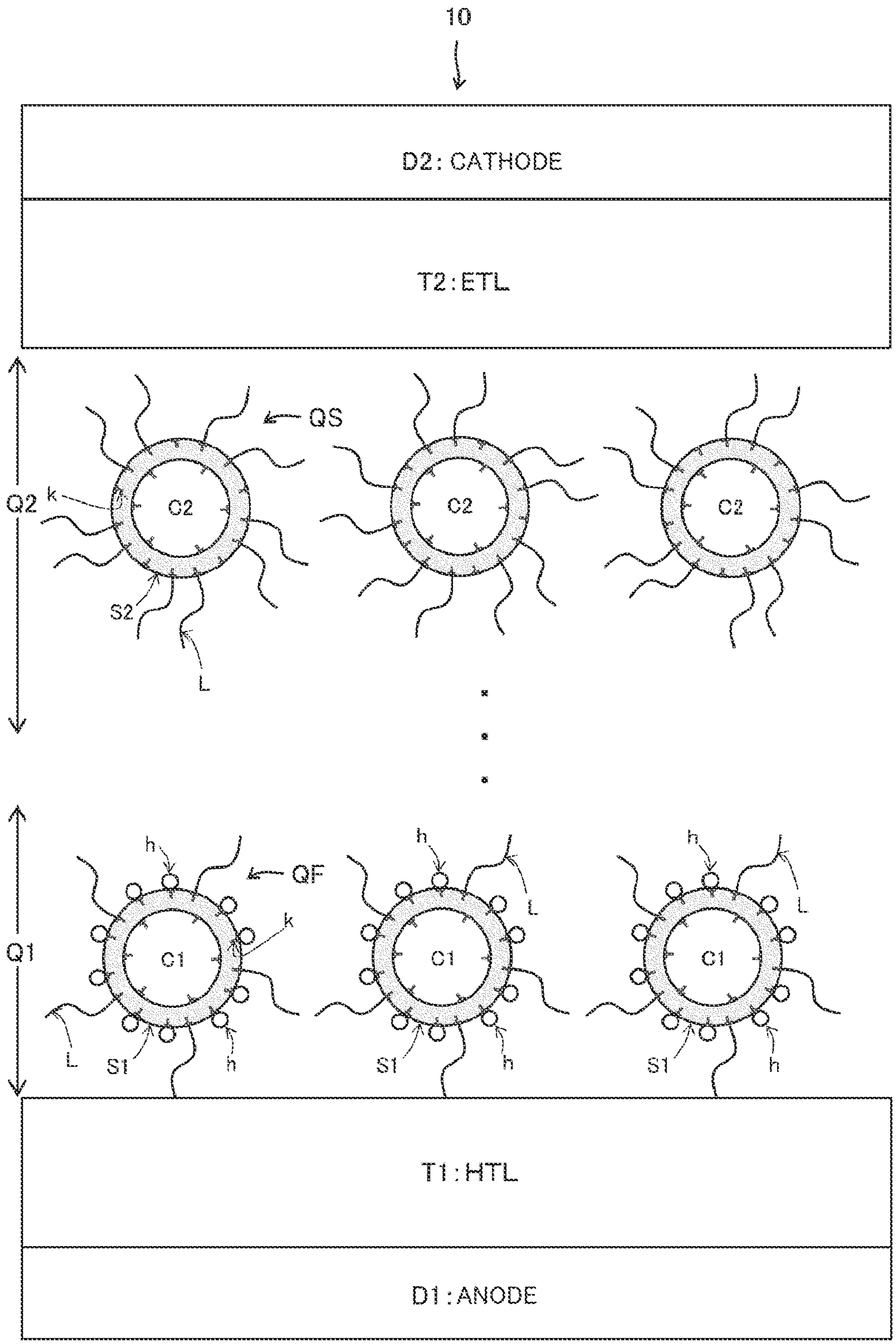
FIG. 3 is a sectional view of an example configuration of a light-emitting element according to Example 1.

FIG. 3 is a sectional view of an example configuration of a light-emitting element according to Example 1. The light-emitting element 10 in FIG. 3 is structured such that the first quantum dot portion Q1 and the second quantum dot portion Q2 are formed in the stated order on the functional layer T1 (HTL), such that the first quantum dot portion Q1 contains halogen elements at a predetermined concentration, and such that the second quantum dot portion Q2 contains no halogen elements. The first quantum dot portion Q1 and the second quantum dot portion Q2 may be in the form of a layer. The halogen element concentration (a predetermined concentration: the number of halogen elements per unit volume) of the first quantum dot portion Q1 may be included in a range of $10^{15}$ elements/cm$^3$ to $10^{23}$ elements/cm$^3$ and may be any concentration (average concentration) within a range of $10^{15}$ elements/cm$^3$ to $10^{19}$ elements/cm$^3$.

The first quantum dot QF includes the core C1 containing no halogen elements, the shell S1 containing halogen elements, and the ligands L. The surface defects k of the shell S1 may be deactivated by the halogen elements h. The surface defects k of the shell S1 may be deactivated by the ligands L. The second quantum dot QS includes the core C2 containing no halogen elements, the shell S2 containing no halogen elements, and the ligands L. The surface defects k of the shell S2 may be deactivated by the ligands L.

Figure 4:
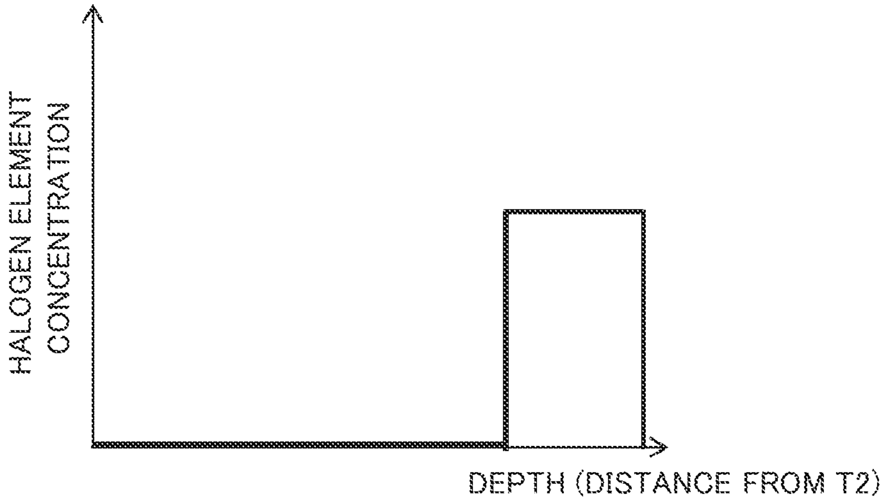
FIG. 4 is a graph showing a relationship between the depth of a light-emitting layer (distance from an ETL) and the concentration of halogen elements.

FIG. 4 is a graph showing a relationship between the depth of a light-emitting layer (distance from an ETL) and the concentration of halogen elements. FIG. 4 reveals that the halogen element concentration is almost zero until a predetermined depth (until the upper end of the first quantum dot portion Q1), and that the halogen element concentration rises to a predetermined concentration at and deeper than the predetermined depth (under the upper end of the first quantum dot portion Q1). Such a profile can be evaluated and confirmed through, for instance, SIMS, AES or other things after the light-emitting layer EM is formed.

Figure 5:
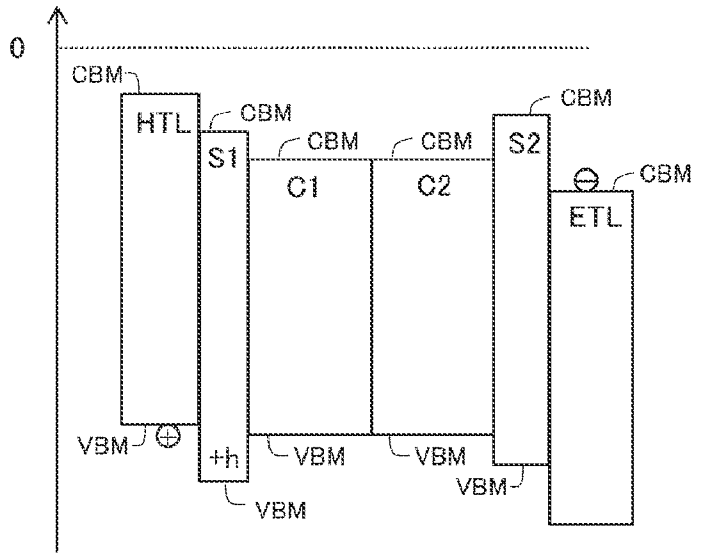
FIG. 5 is a band diagram of the light-emitting element according to the first embodiment.

FIG. 5 is a band diagram of the light-emitting element according to the first embodiment. The gap between a conduction band minimum (CBM) and a valence band maximum (VBM) is a band gap. The CBM and the VBM are negative values (unit: eV) with a vacuum level as its reference value (zero); for instance, the gap between the CBM and vacuum level is electron affinity, and the gap between the VBM and vacuum level is ionization energy. It is noted that the gap herein indicates the presence of a gap per se in some cases, and that the gap herein indicates the size of a gap in a band diagram in other cases. The CBM of the second quantum dot QS may be the CBM of the core C2 or the CBM of the shell S2, whichever is shallower (whichever is closer to the vacuum level). The VBM of the first quantum dot QF may be the VBM of the core C1 or the VBM of the shell S1, whichever is deeper (whichever is more distant from the vacuum level). It is noted that in the present disclosure, "deep" or "low" in relation to the CBM and VBM means that corresponding electron affinity or corresponding ionization energy is large, and that in the present disclosure, "shallow" or "high" in relation to the CBM and VBM means that corresponding electron affinity or corresponding ionization energy is small.

In FIG. 5, the CBM (CBM of S2) of the second quantum dot QS is shallower than the CBM (CBM of S1) of the first quantum dot QF. In addition, the gap between the VBM of the hole transport layer HTL and the VBM (VBM of S1) of the first quantum dot QF is smaller than the gap between the CBM (CBM of S2) of the second quantum dot QS and the CBM of the electron transport layer ETL.

A light-emitting element typically has low hole mobility; many of the holes injected from the first electrode D1 (anode) through the functional layer T1 (HTL) into the light-emitting layer EM are distributed in a region close to the HTL, and it is thus highly probable that recombination for light emission occurs in this region. In the first embodiment, the first quantum dot portion Q1, which is closer to the HTL, has a high halogen element concentration, and the surface defects k of the shell S1 of the first quantum dot QF is deactivated by the halogen elements h and ligands L, thereby enhancing external quantum efficiency.

A halogen element has the property of deepening a CBM; since the second quantum dot portion Q2, which is closer to the ETL, contains no halogen elements, an electron injection barrier (gap between the CBM of the ETL and the CBM of the shell S2) does not become low, as illustrated in FIG. 4. Further, the shell S2 of the second quantum dot QS has non-inert surface defects k, thereby preventing electron injection. This can enhance the carrier balance of a quantum-dot light-emitting element, which typically has excessive electrons.

Figure 6:
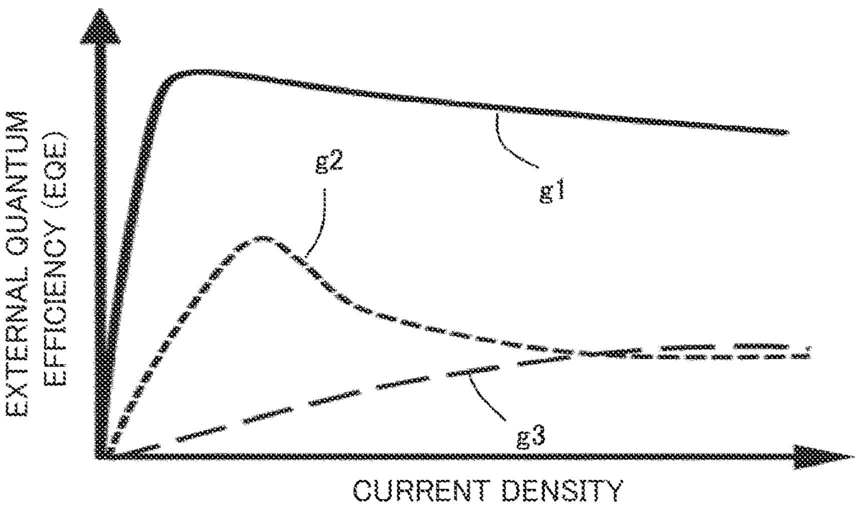
FIG. 6 is a graph showing a relationship between current density and external quantum efficiency.

FIG. 6 is a graph showing a relationship between current density and external quantum efficiency. A case (g1) in which the concentration of halogens that are disposed on the shell's surface is decreased from the HTL toward the ETL, like that in the light-emitting layer EM according to the first embodiment, offers higher external quantum efficiency (EQE) and more excellent light emission efficiency than a case (g3) in which the light-emitting layer contains no halogen elements, and a case (g2) in which the concentration of halogens that are disposed on the shell's surface does not vary in the layer thickness direction.

The first quantum dot portion Q1 may be thinner than the second quantum dot portion Q2 in Example 1. In this case, it is highly probable that an electron and a hole recombine together in the first quantum dot QF as a consequence of a band shift in the first quantum dot QF, which has a high halogen element concentration. Further, hole injection into the first quantum dot QF improves, thus enhancing light emission efficiency in the first quantum dot portion Q1.

With regard to materials that constitute the first quantum dot QF and the second quantum dot QS, the core C1 and the core C2 may be made of an identical material, and the shell S1 and the shell S2 may be also made of an identical material; alternatively, the core C1 and the core C2 may be made of an identical material, and the shell S1 and the shell S2 may be made of different materials; alternatively, the core C1 and the core C2 may be made of different materials, and the shell S1 and the shell S2 may be made of an identical material; alternatively, the core C1 and the core C2 may be made of different materials, and the shell S1 and the shell S2 may be also made of different materials.

In the first embodiment, the first quantum dot QF may be regarded as having ligands when the first quantum dot portion Q1 contains a ligand material (ornamental compound). Likewise, the second quantum dot QS may be regarded as having ligands when the second quantum dot portion Q2 contains a ligand material.

The ligand material may include an organic compound, may include a halogen element or may include a metal element. The concentration of the ligand material in the first quantum dot portion Q1 may be smaller than the concentration of the ligand material in the second quantum dot portion Q2.

The ligand material may have n (n is a natural number) carbon atoms each of which bonds with a hydrogen atom, or the ligand material may have n chain-shaped structures in which a different kind of element is bonded at two coordinate sites of an element with four or more pieces of coordination number, and the mass ratio of the ligand material to the first quantum dot QF may be 5/(10×n) or less. Further, n may be three or greater. The ligand material may be an inorganic compound having n chain-shaped structures, an organic compound having n chain-shaped structures, or a perfluoro compound having n chain-shaped structures.

Figure 7:
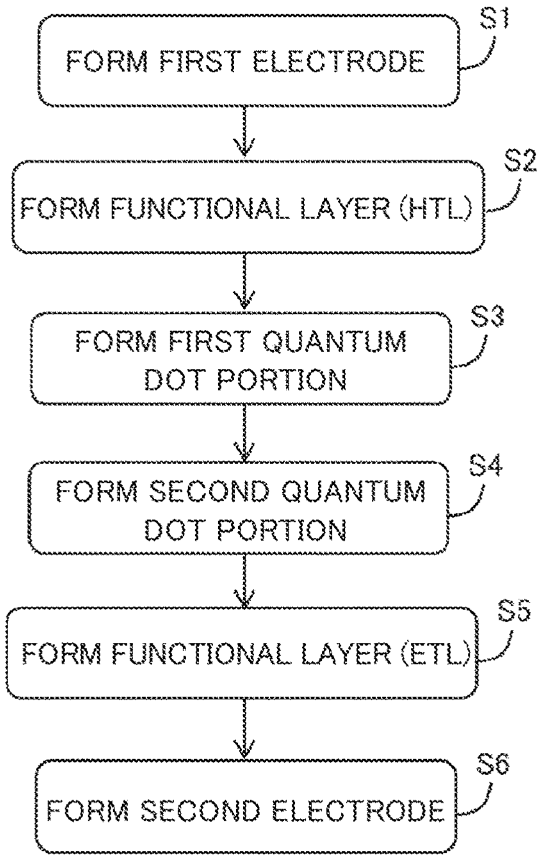
FIG. 7 is a flowchart showing a method for manufacturing a quantum dot material according to Example 1.

FIG. 7 is a flowchart showing a method for manufacturing a quantum dot material according to Example 1. In FIG. 7, the first electrode D1 is formed in Step S1, the functional layer T1 (HTL) is formed in Step S2, the first quantum dot portion Q1 is formed in Step S3, the second quantum dot portion Q2 is formed in Step S4, the functional layer T2 (ETL) is formed in Step S5, and the second electrode D2 is formed in Step S6.

The first electrode D1 that is a reflective electrode may be formed in Step S1. The reflective electrode may be made of, for instance, a light-reflective material, such as metal, including Ag and aluminum (Al), or alloy containing these metals, or may be formed by stacking a light-transparent material and a light-reflective material (e.g., a stacked structure of ITO, Ag alloy, and ITO, a stacked structure of ITO, Ag, and ITO, a stacked structure of Al and IZO, or a stacked structure of other combinations).

For instance, a process step of applying a solution with poly-TPD, which is an HTL material, dispersed in a chlorobenzene solvent, and removing the solvent is performed in Step S2. A hole injection layer (containing, for instance, NiO, PEDOT:PSS, or $MoO_3$ as an HTL material) may be formed in a process step between Step S1 and Step S2.

A process step of applying a first colloidal solution containing the first quantum dot QF containing halogen elements on its surface, and a solvent (e.g., octane) onto the functional layer T1, and removing the solvent is performed in Step S3. This forms the first quantum dot portion Q1. The first quantum dot portion Q1 may contain a ligand material, and after the first quantum dot portion Q1 is formed, a part (surplus) of the ligand material may be discharged by applying a liquid.

A process step of applying a second colloidal solution containing the second quantum dot QS containing no halogen elements, and a solvent (e.g., octane) onto the first quantum dot portion Q1, and removing the solvent is performed in Step S4. This forms the second quantum dot portion Q2.

A process step of applying a solution (nanoparticle solution) with ZnO nanoparticles, which are an ETL material, dispersed in a solvent onto the light-emitting layer EM, and removing the solvent is performed in Step S5.

The second electrode D2 that is a light-transparent electrode may be formed in Step S6. The light-transparent electrode is made of, for instance, a light-transparent material, such as indium tin oxide (ITO), indium zinc oxide (IZO), silver nanowires (AgNW), a thin film of magnesium-silver (MgAg) alloy, or a thin film of silver (Ag).

Figure 8:
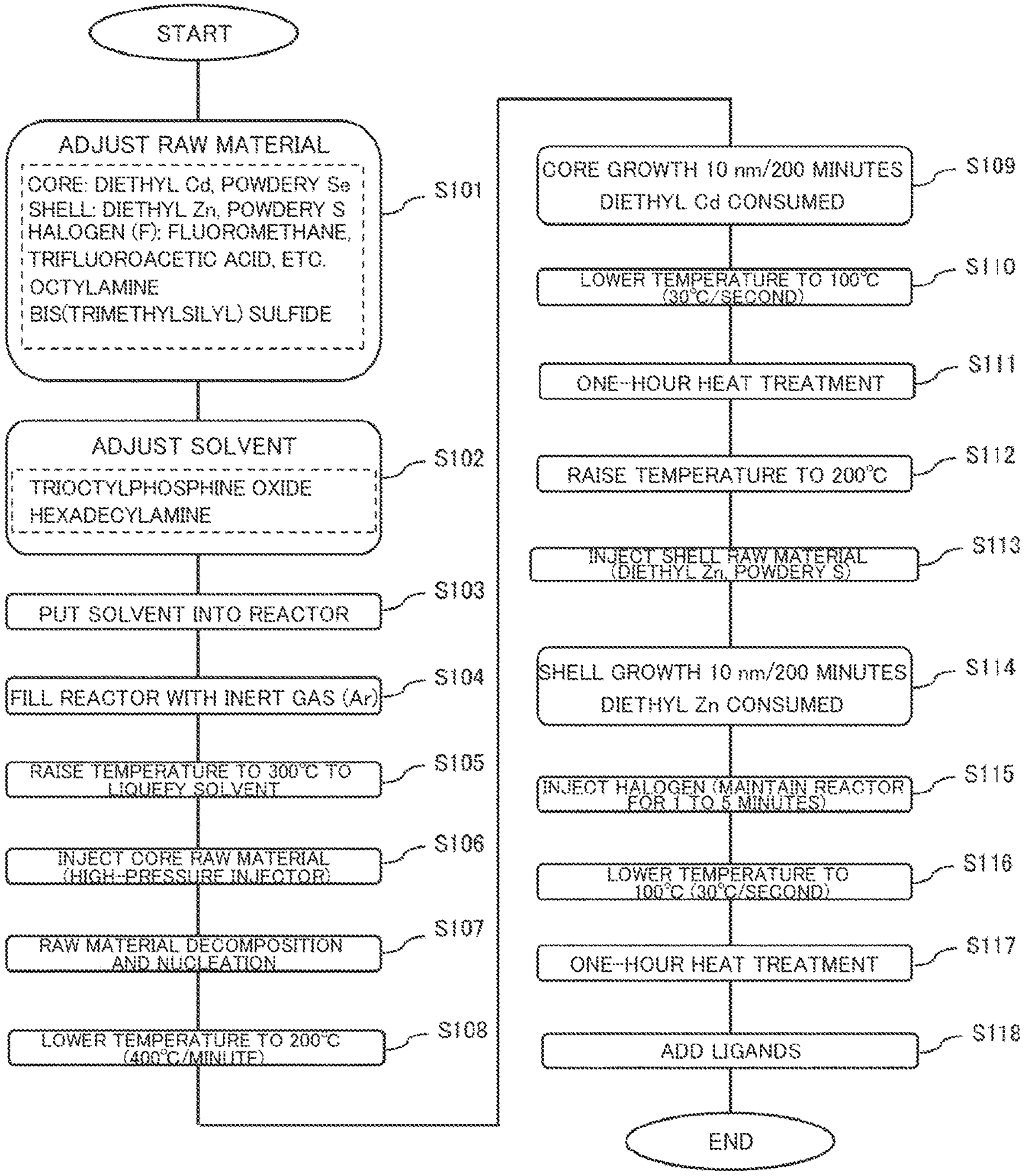
FIG. 8 is a flowchart showing a method for manufacturing a first quantum dot material.
Figure 9:
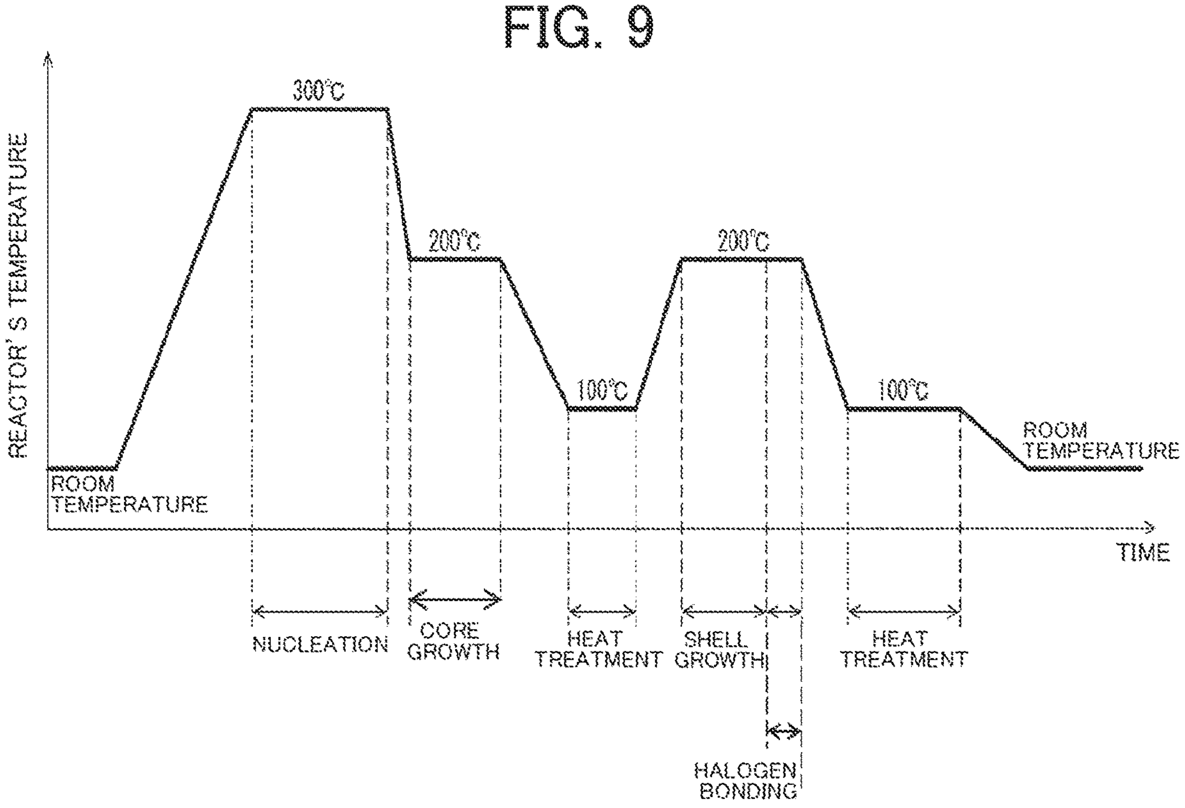
FIG. 9 is a timing chart showing the time passage of the temperature of a reactor.

FIG. 8 is a flowchart showing a method for manufacturing a first quantum dot material. FIG. 9 is a timing chart showing the time passage of the temperature of a reactor. Raw material adjustment is performed in Step S101. Solvent adjustment is performed in Step S102. A solvent is put into the reactor in Step S103. The reactor is filled with an inert gas (e.g., argon) in Step S104. In Step S105, the reactor's temperature is raised to 300° C. to liquefy the solvent. A core raw material (e.g., diethyl Cd or powdery selenium (Se)) is injected using a high-pressure injector in Step S106. Raw material decomposition and nucleation occur in Step S107. The reactor's temperature is lowered to 200° C. (400° C./minute) in Step S108. In Step S109, the core C1 grows (10 nm/200 minutes), and the diethyl Cd is consumed. The reactor's temperature is lowered to 100° C. (30° C./second) in Step S110. One-hour heat treatment is executed in Step S111. The reactor's temperature is raised to 200° C. in Step S112. A shell raw material (diethyl Zn or powdery sulfur(S)) is injected into the reactor in Step S113. In Step S114, the shell S1 grows (10 nm/200 minutes), and the diethyl Zn is consumed. In Step S115, a halogen element material (fluoromethane, trifluoroacetic acid, and other things) is injected into the reactor, and then the reactor is maintained for 1 to 5 minutes. The reactor's temperature is lowered to 100° C. (30° C./second) in Step S116. One-hour heat treatment is executed in Step S117. Ligand addition is performed in Step S118. Through the foregoing process steps, a quantum dot material is obtained that contains quantum dots each having a core containing halogen elements, a shell containing halogen elements, and ligands. The mole ratio between a group II raw material (diethyl Cd or diethyl Zn), a group VI raw material (selenium (Se) or sulfur(S)), and a halogen-element raw material (fluoromethane and other things) is set at 10:9:0.01 for instance. In Step S3 in FIG. 7, dispersing the quantum dot material that is obtained in FIG. 8 into a solvent can produce the first colloidal solution containing the first quantum dot QF.

Figure 10:
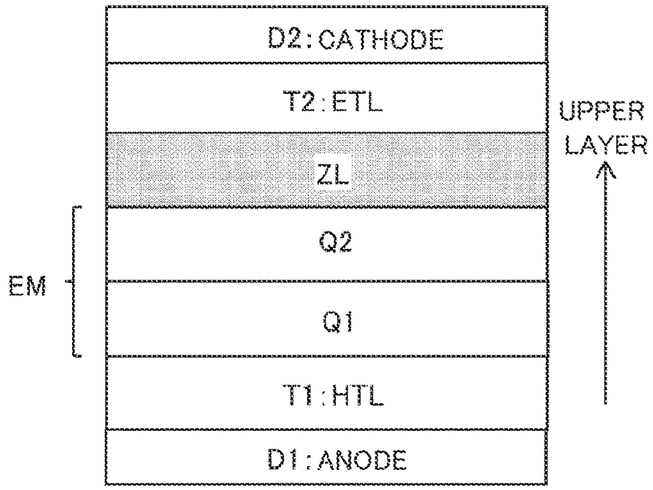
FIG. 10 schematically illustrates another example configuration of the light-emitting element according to the first embodiment.

FIG. 10 schematically illustrates another example configuration of the light-emitting element according to the first embodiment. The light-emitting element 10 in FIG. 10 includes an insulating layer ZL disposed between the second quantum dot portion Q2 and the functional layer T2 (ETL). In this case, the insulating layer ZL prevents electric-charge injection from the functional layer T2 (ETL) into the light-emitting layer EM, thereby improving carrier balance. The insulating layer ZL does not have to be in the form of an island and does not have to have a uniform thickness.

The insulating layer ZL may be amorphous and may contain at least one of a glass material, a tetrafluoroethylene material, and a silicone material. In view of the use efficiency of light, the insulating layer ZL preferably has a light transmittance of 80% or greater in a visible-light range. The insulating layer ZL may contain an ether solvent, a perfluoro solvent, or a hydrocarbon solvent. This reinforces the effect of electron injection prevention. The insulating layer ZL preferably has a thickness of 5 nm or less. This maintains a tunnel current that flows through the second quantum dot portion Q2.

Figure 11:
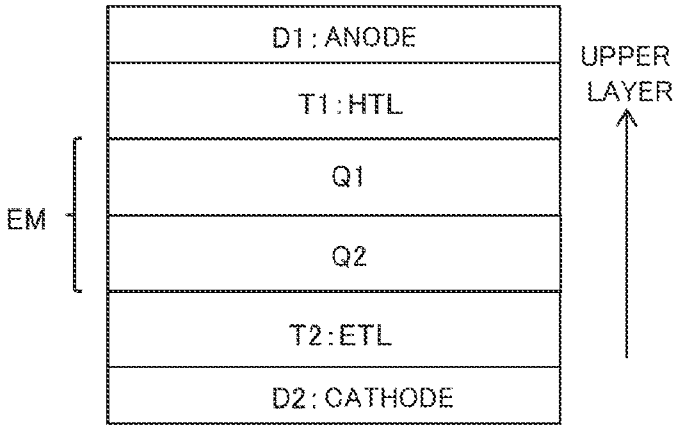
FIG. 11 schematically illustrates another example configuration of the light-emitting element according to the first embodiment.

FIG. 11 schematically illustrates another example configuration of the light-emitting element according to the first embodiment. The light-emitting element 10 in FIG. 11 is structured such that the first electrode D1, which is an anode, is located over the second electrode D2 (reverse structure), which is a cathode, and such that the second electrode D2 (cathode), the functional layer T2 (ETL), the second quantum dot portion Q2, the first quantum dot portion Q1, the functional layer T1 (HTL), and the first electrode D1 (anode) are disposed sequentially on a pixel circuit board (described later on).

Example 2

Figure 12:
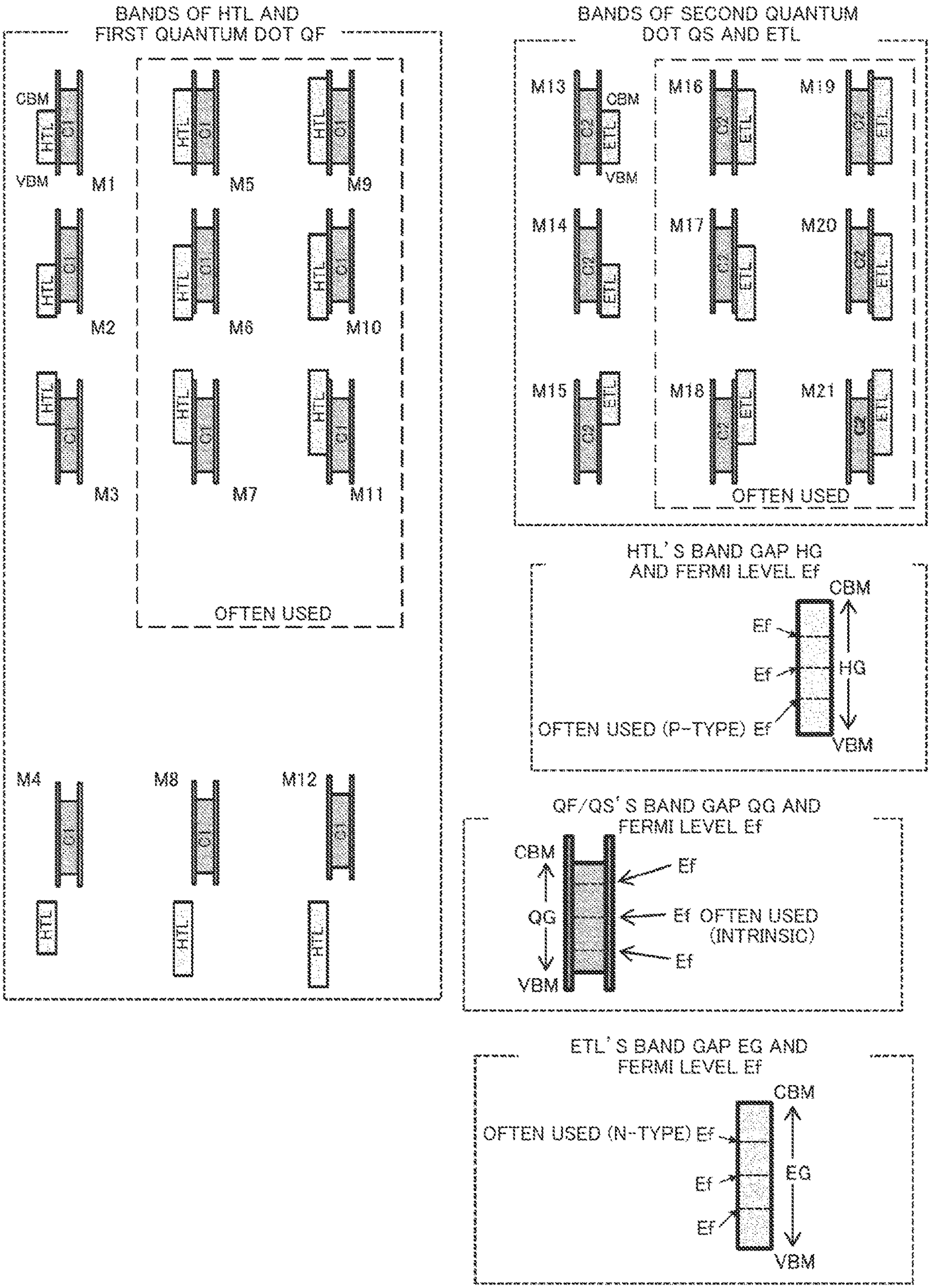
FIG. 12 is a band diagram illustrating an example band gap of each part of the light-emitting element.

FIG. 12 is a band diagram illustrating an example band gap of each part of the light-emitting element. FIG. 12 illustrates models where the first quantum dot and the second quantum dot may contain no halogen elements, where the band gap of the core (C1) of the first quantum dot may be within the band gap of the shell of the first quantum dot, and where the band gap of the core (C2) of the second quantum dot may be within the band gap of the shell of the second quantum dot.

In models M1 to M4, the HTL's band gap is smaller than the band gap of the core C1 of the first quantum dot; the VBM of the core C1 of the first quantum dot may be equal to the HTL's VBM (M1), may be higher than the HTL's VBM (M2 and M4) or may be lower than the HTL's VBM (M3). The HTL's band gap and the band gap of the core C1 of the first quantum dot may overlap (M1 to M3) or may not overlap (M4).

In models M5 to M8, the HTL's band gap is equal to the band gap of the core C1 of the first quantum dot; the VBM of the core C1 of the first quantum dot may be equal to the HTL's VBM (M5), may be higher than the HTL's VBM (M6 and M8) or may be lower than the HTL's VBM (M7). The HTL's band gap and the band gap of the core C1 of the first quantum dot may overlap (M5 to M7) or may not overlap (M8).

In models M9 to M12, the HTL's band gap is larger than the band gap of the core C1 of the first quantum dot; the VBM of the core C1 of the first quantum dot may be equal to the HTL's VBM (M9), may be higher than the HTL's VBM (M10 and M12) or may be lower than the HTL's VBM (M11). The HTL's band gap and the band gap of the core C1 of the first quantum dot may overlap (M9 to M11) or may not overlap (M12).

The models M1 are M12 are available, among which the models M5 to M7 and the models M9 to M11 are often used as examples.

In models M13 to M15, the ETL's band gap is smaller than the band gap of the core C2 of the second quantum dot; the CBM of the core C2 of the second quantum dot is not equal to the ETL's CBM, but the CBM of the core C2 of the second quantum dot may be of the same configuration as the ETL. To be specific, the VBM of the core C2 of the second quantum dot may be equal to or as high as the ETL's VBM, and the CBM of the core C2 of the second quantum dot may be higher than that of the ETL (M13). Further, the VBM and CBM of the core C2 of the second quantum dot may be higher than the ETL's VBM and CBM, respectively (M14); alternatively, the ETL's VBM may be higher than the VBM of the core C2 of the second quantum dot, and the CBM of the core C2 of the second quantum dot may be lower than the ETL's CBM (M15). They all may be higher than the ETL's CBM (M14) or may be lower than the ETL's CBM (M15). The ETL's band gap and the band gap of the core C2 of the second quantum overlap (M13 to M15).

In models M16 to M18, the ETL's band gap is equal to the band gap of the core C2 of the second quantum dot; the CBM of the core C2 of the second quantum dot may be equal to the ETL's CBM (M16), the CBM and VBM of the core C2 of the second quantum dot may be higher than the ETL's CBM and VBM, respectively (M17), or the CBM and VBM of the core C2 of the second quantum dot may be lower than the ETL's CBM and VBM, respectively (M18). In these cases, the ETL's band gap and the band gap of the core C2 of the second quantum dot overlap (M16 to M18).

In models M19 to M21, the ETL's band gap is larger than the band gap of the core C2 of the second quantum dot; the CBM of the core C2 of the second quantum dot may be lower than the ETL's CBM, and the VBM of the same may be equal to or as high as the ETL's VBM (M19), the CBM and VBM of the core C2 of the second quantum dot may be higher than the ETL's CBM and VBM, respectively (M20), or the CBM and VBM of the core C2 of the second quantum dot may be lower than the ETL's CBM and VBM, respectively (M21). The ETL' band gap and the band gap of the core C2 of the second quantum dot overlap (M19 to M21).

The models M13 are M21 are available, among which the models M16 to M21 are often used as examples.

Although the HTL's Fermi level, Ef, may be above the middle of a band gap HG (close to a vacuum level), in the middle of the band gap HG, or under the middle of the band gap HG, the example where the Fermi level Ef is under the middle (P-type semiconductor) is often used.

Although the Fermi levels Ef of the first quantum dot QF and second quantum dot QS may be above the middle of a band gap QG (close to a vacuum level), in the middle of the band gap QG, or under the middle of the band gap QG, the example where the Fermi levels Ef are in the middle (intrinsic semiconductor) is often used.

Although the ETL's Fermi level Ef may be above the middle of a band gap EG (close to a vacuum level), in the middle of the band gap EG, or under the middle of the band gap EG, the example where the Fermi level Ef is above the middle (N-type semiconductor) is often used.

Figure 13:
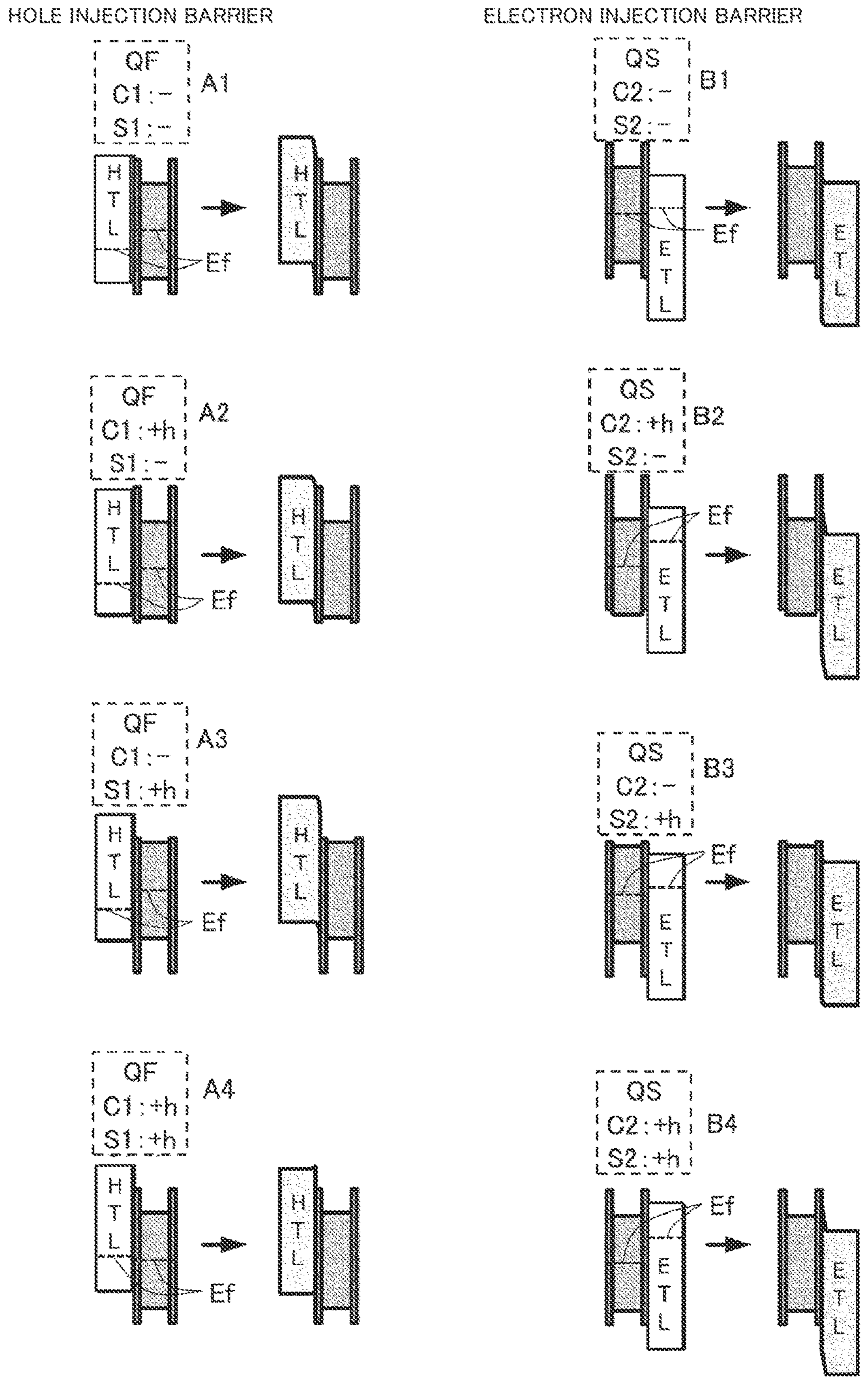
FIG. 13 is a band diagram illustrating example combinations of the first quantum dot and an HTL, and example combinations of the second quantum dot and an ETL.

FIG. 13 is a band diagram illustrating example combinations of the first quantum dot and HTL, and example combinations of the second quantum dot and ETL. Here, on the basis of the model M11 and model M20 in FIG. 12, a p-type semiconductor is used as the HTL, an intrinsic semiconductor is used as the first and second quantum dots, and an N-type semiconductor is used as the ETL.

In a combination A1, the core C1 and shell S1 of the first quantum dot QF contain no halogen elements. In a combination A2, the core C1 of the first quantum dot QF contains halogen elements, and its shell S1 contains no halogen elements. In a combination A3, the core C1 of the first quantum dot QF contains no halogen elements, and its shell S1 contains halogen element. In a combination A4, the core C1 and shell S1 of the first quantum dot QF contain halogen elements. FIG. 13 reveals that the combination A2 exhibits a small hole injection barrier, and that the combination A3 exhibits a large hole injection barrier. The hole injection barrier needs to be small in view of carrier balance, in which electrons are supposed to be excessive.

It is noted that the shell may be regarded as "containing no halogen elements" when there is a quantum dot (QF or QS) in one cross-section of a quantum dot portion (Q1 or Q2) taken along a plane parallel to any thickness direction (y-direction) of the light-emitting element 10, wherein the detected concentration of halogen elements in part of the shell surface of this quantum dot measures less than $10^{15}$ elements/$cm^3$, or less than a limit of detection (non-detection) in a measuring apparatus. Likewise, the core may be regarded as "containing no halogen elements" when there is a quantum dot (QF or QS) in one cross-section of a quantum dot portion (Q1 or Q2) taken along a plane parallel to any thickness direction (y-direction) of the light-emitting element 10, wherein the detected concentration of halogen elements in part of the core surface of this quantum dot measures less than $10^{15}$ elements/$cm^3$, or less than a limit of detection (non-detection) in a measuring apparatus.

It is also noted that the shell may be regarded as "containing halogen elements" when there is a quantum dot (QF or QS) in one cross-section of a quantum dot portion (Q1 or Q2) taken along a plane parallel to any thickness direction (y-direction) of the light-emitting element 10, wherein the detected concentration of halogen elements in the shell surface of this quantum dot or in the vicinity of the shell surface measures $10^{15}$ elements/$cm^3$ or greater. Likewise, the core may be regarded as "containing halogen elements" when there is a quantum dot (QF or QS) in one cross-section of a quantum dot portion (Q1 or Q2) taken along a plane parallel to any thickness direction (y-direction) of the light-emitting element 10, wherein the detected concentration of halogen elements in the core surface of this quantum dot or in the vicinity of the core surface measures $10^{15}$ elements/$cm^3$ or greater.

In a combination B1, the core C2 and shell S2 of the second quantum dot QS contain no halogen elements. In a combination B2, the core C2 of the second quantum dot QS contains halogen elements, and its shell S2 contains no halogen elements. In a combination B3, the core C2 of the second quantum dot QS contains no halogen elements, and its shell S2 contains halogen elements. In a combination B4, the core C2 and shell S2 of the second quantum dot QS contain halogen elements. FIG. 13 reveals that the combination B3 exhibits a small electron injection barrier, and that the combination B2 exhibits a large electron injection barrier. The electron injection barrier needs to be large in view of carrier balance, in which electrons are supposed to be excessive.

Figure 14:
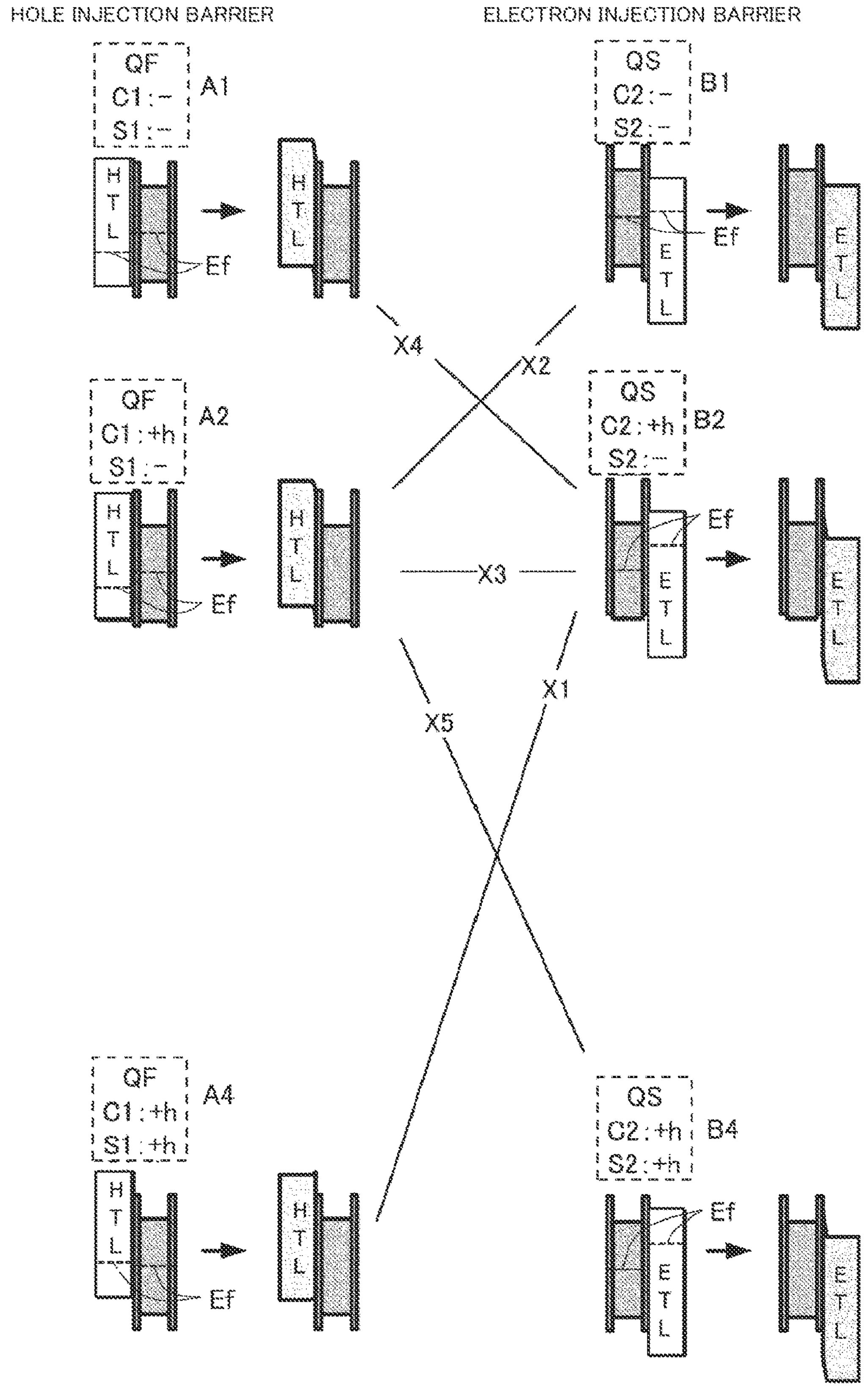
FIG. 14 is a band diagram illustrating example combinations of the first quantum dot as well as the second quantum dot and the HTL as well as the ETL.

FIG. 14 is a band diagram illustrating example combinations of the first quantum dot as well as the second quantum dot and the HTL as well as the ETL. Example 2 describes a configuration X1, where the combination A4 and combination B2 illustrated in FIG. 14 are used, a configuration X2, where the combination A2 and combination B1 in FIG. 14 are used, a configuration X3, where the combination A2 and combination B2 in FIG. 14 are used, a configuration X4, where the combination A1 and combination B2 in FIG. 14 are used, and a configuration X5, where the combination A2 and combination B4 in FIG. 14 are used.

Figure 15:
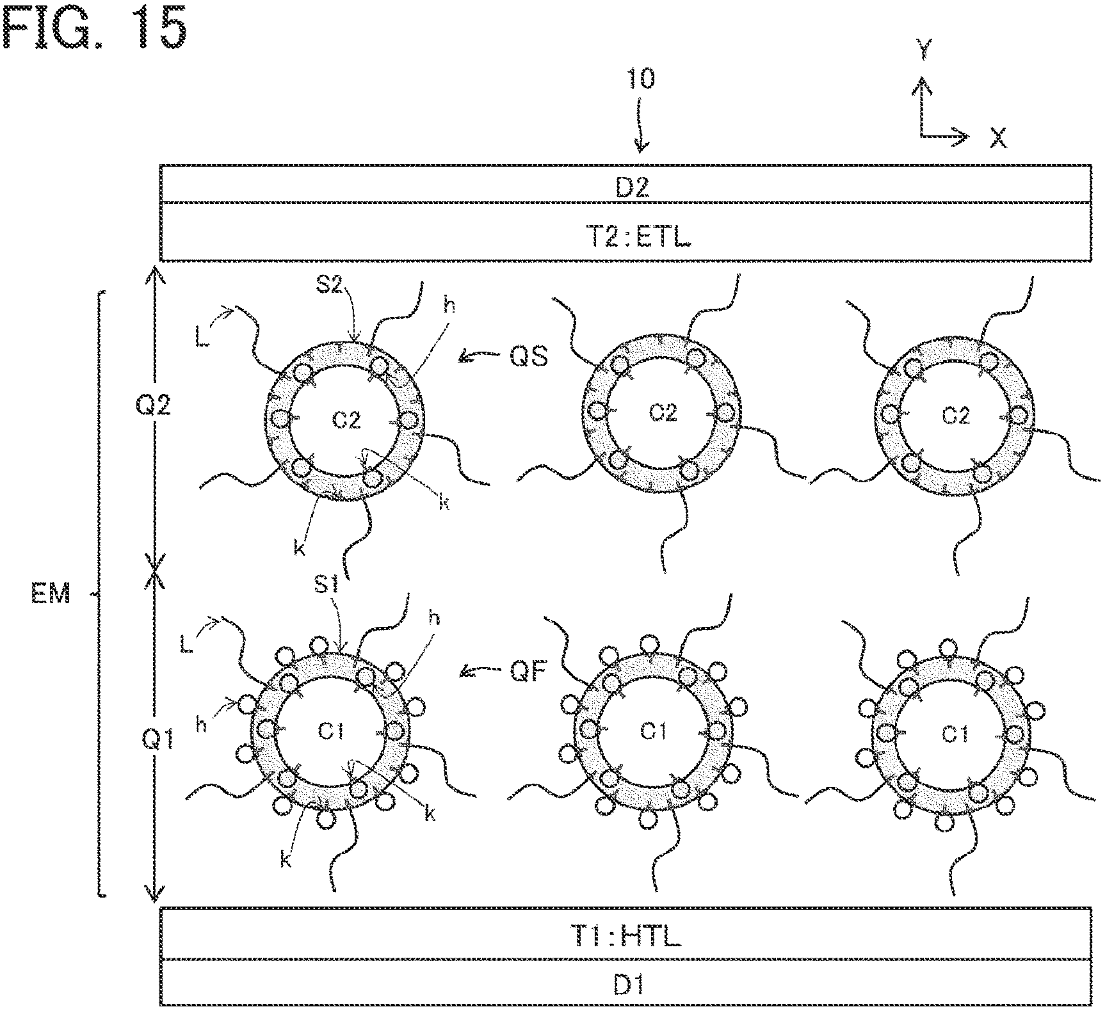
FIG. 15 is a sectional view of a configuration X1 in FIG. 14.
Figure 16:
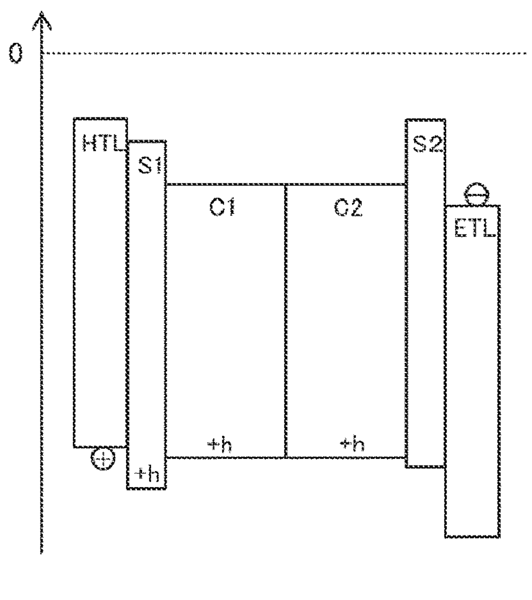
FIG. 16 is a band diagram of the light-emitting element in FIG. 15.

FIG. 15 is a sectional view of the configuration X1 in FIG. 14. FIG. 16 is a band diagram of the light-emitting element in FIG. 15. The light-emitting element 10 in FIG. 15 is structured such that the first quantum dot portion Q1 and the second quantum dot portion Q2 are formed in the stated order on the functional layer T1 (HTL), such that the first quantum dot portion Q1 contains halogen elements at a predetermined concentration, and such that the second quantum dot portion Q2 contains halogen elements at a lower concentration than the predetermined concentration. The first quantum dot portion Q1 and the second quantum dot portion Q2 may be in the form of a layer.

The first quantum dot QF includes the core C1 containing halogen elements, the shell S1 containing halogen elements, and the ligands L. The surface defects k of the core C1 may be deactivated by the halogen elements h, and the surface defects k of the shell S1 may be deactivated by the halogen elements h. The surface defects k of the shell S1 may be deactivated by the ligands L. The band gap of the core C1 of the first quantum dot QF may be within the band gap of the shell S1 of the first quantum dot QF (the shell S1 has a shallower CBM and a deeper VBM than the core C1).

The second quantum dot QS includes the core C2 containing halogen elements, the shell S2 containing no halogen elements, and the ligands L. The surface defects k of the core C2 may be deactivated by the halogen elements h, and the surface defects k of the shell S2 may be deactivated by the ligands L. The band gap of the core C2 of the second quantum dot QS may be within the band gap of the shell S2 of the second quantum dot QS (the shell S2 has a shallower CBM and a deeper VBM than the core C2). The second quantum dot QS, when having, inside its surface, a portion having a higher halogen element concentration than the surface, may be regarded as having the core C2 containing halogen elements, and the shell S2 containing no halogen elements.

In FIG. 16, the hole injection barrier is smaller, and the electron injection barrier is larger than those in a case (g2 in FIG. 6) where the concentration of halogens disposed in the shell surface does not vary in the layer thickness direction, and hence, carrier balance improves when compared with this case. In addition, the surface defects of the core C1 and shell S1 of the first quantum dot QF near the HTL are inert, and hence, the probability of recombination for light emission is high. Consequently, the configuration X1 illustrated in FIG. 15 offers high EQE.

With regard to materials that constitute the first quantum dot QF and the second quantum dot QS, the core C1 and the core C2 may be made of an identical material, and the shell S1 and the shell S2 may be also made of an identical material; alternatively, the core C1 and the core C2 may be made of an identical material, and the shell S1 and the shell S2 may be made of different materials; alternatively, the core C1 and the core C2 may be made of different materials, and the shell S1 and the shell S2 may be made of an identical material; alternatively, the core C1 and the core C2 may be made of different materials, and the shell S1 and the shell S2 may be also made of different materials. Further, the halogen elements of the core C1, the halogen elements of the shell S1, and the halogen elements of the core C2 may be identical (a single kind of elements) or different (two or three kinds of elements).

Figure 17:
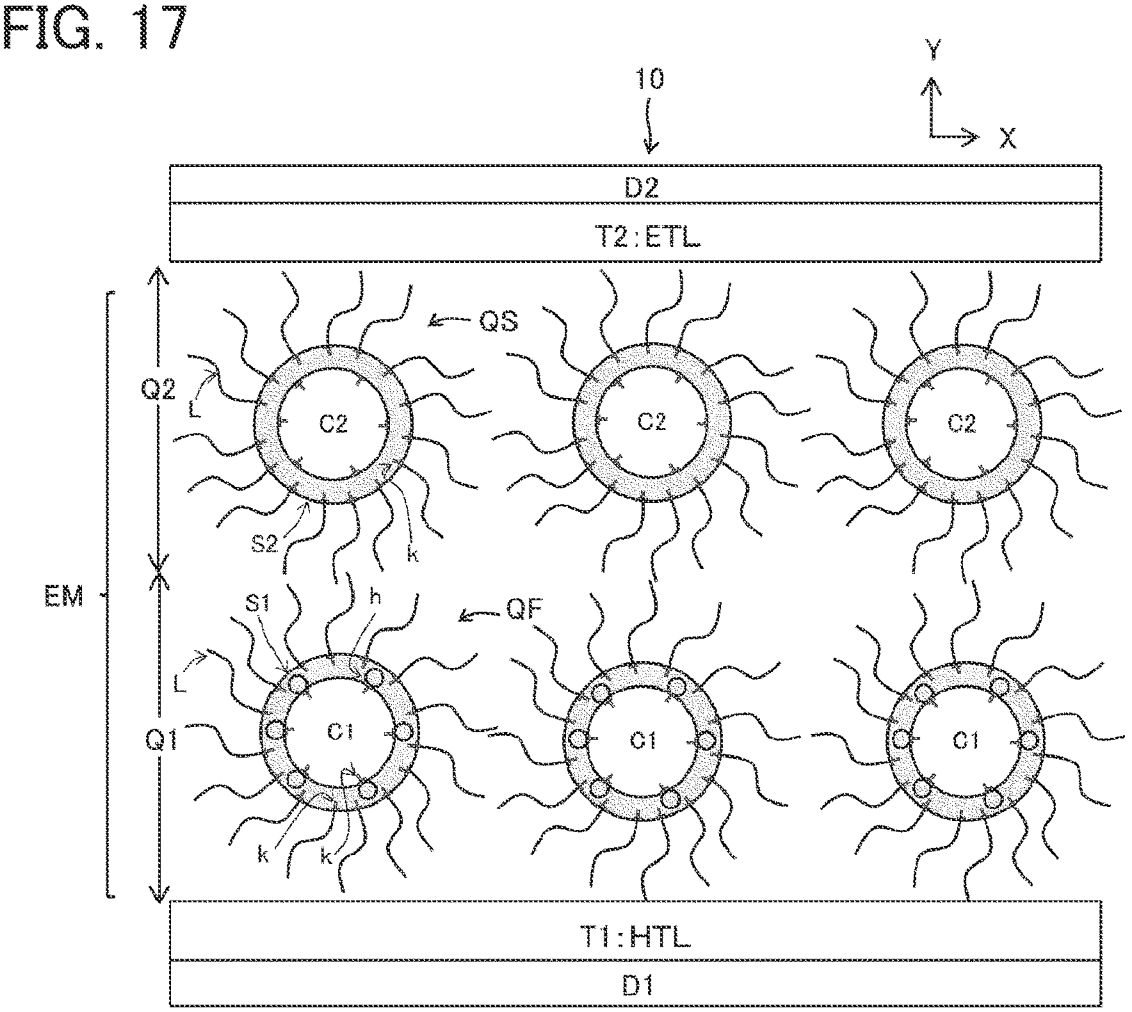
FIG. 17 is a sectional view of a configuration X2 in FIG. 14.
Figure 18:
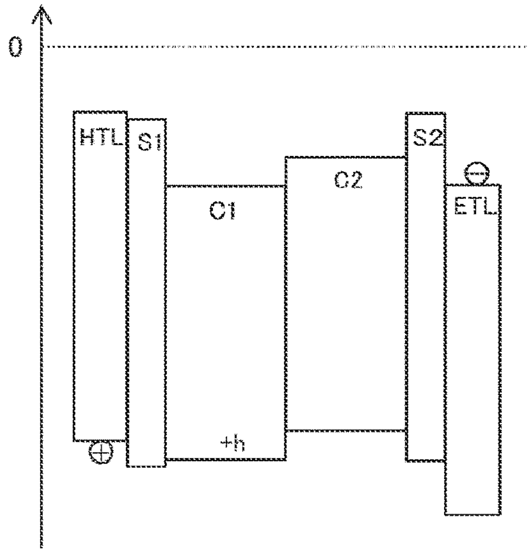
FIG. 18 is a band diagram of the light-emitting element in FIG. 17.

FIG. 17 is a sectional view of the configuration X2 in FIG. 14. FIG. 18 is a band diagram of the light-emitting element in FIG. 17. The light-emitting element 10 in FIG. 17 is structured such that the first quantum dot portion Q1 and the second quantum dot portion Q2 are formed in the stated order on the functional layer T1 (HTL), such that the first quantum dot portion Q1 contains halogen elements at a predetermined concentration, and such that the second quantum dot portion Q2 contains no halogen elements. The first quantum dot portion Q1 and the second quantum dot portion Q2 may be in the form of a layer.

The first quantum dot QF includes the core C1 containing halogen elements, the shell S1 containing no halogen elements, and the ligands L. The surface defects k of the core C1 may be deactivated by the halogen elements h, and the surface defects k of the shell S1 may be deactivated by the ligands L. The band gap of the core C1 of the first quantum dot QF may be within the band gap of the shell S1 of the first quantum dot QF. The first quantum dot QF, when having, inside its surface, a portion having a higher halogen element concentration than the surface, may be regarded as having the core C1 containing halogen elements, and the shell S1 containing no halogen elements.

The second quantum dot QS includes the core C2 containing no halogen elements, the shell S2 containing no halogen elements, and the ligands L. The surface defects k of the shell S2 may be deactivated by the ligands L. The band gap of the core C2 of the second quantum dot QS may be within the band gap of the shell S2 of the second quantum dot QS.

In FIG. 18, the hole injection barrier is smaller, and the electron injection barrier is larger than those in the case (g2 in FIG. 6) where the concentration of halogens disposed in the shell surface does not vary in the layer thickness direction, and hence, carrier balance improves when compared with this case. In addition, the surface defects of the core C1 of the first quantum dot QF near the HTL are inert, and hence, the probability of recombination for light emission is high. Consequently, the configuration X2 illustrated in FIG. 17 offers high EQE.

Figure 19:
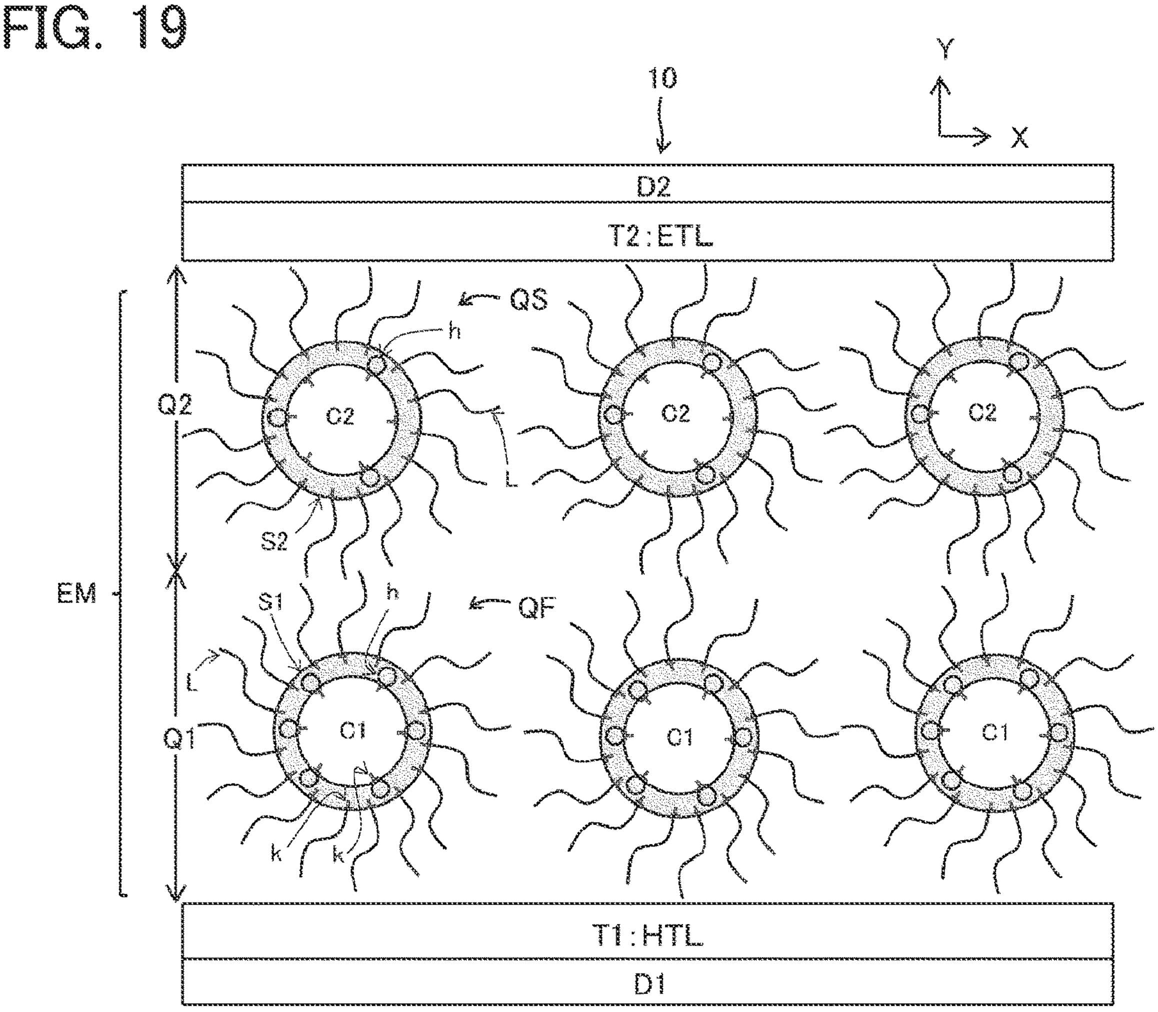
FIG. 19 is a sectional view of a configuration X3 in FIG. 14.
Figure 20:
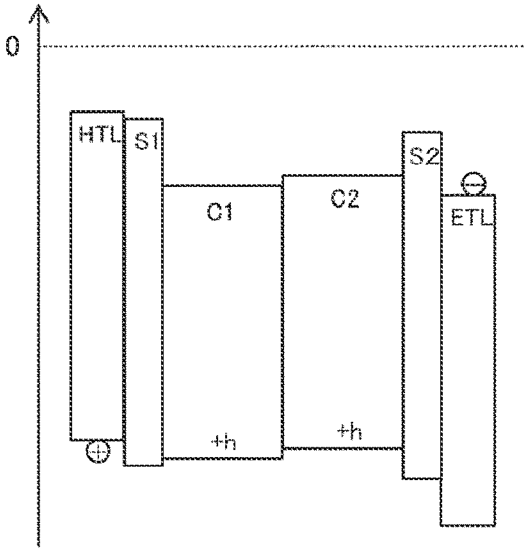
FIG. 20 is a band diagram of the light-emitting element in FIG. 19.

FIG. 19 is a sectional view of the configuration X3 in FIG. 14. FIG. 20 is a band diagram of the light-emitting element in FIG. 19. The light-emitting element 10 in FIG. 19 is structured such that the first quantum dot portion Q1 and the second quantum dot portion Q2 are formed in the stated order on the functional layer T1 (HTL), such that the first quantum dot portion Q1 contains halogen elements at a predetermined concentration, and such that the second quantum dot portion Q2 contains halogen elements at a lower concentration than the predetermined concentration. The first quantum dot portion Q1 and the second quantum dot portion Q2 may be in the form of a layer.

The first quantum dot QF includes the core C1 containing halogen elements, the shell S1 containing no halogen elements, and the ligands L. The surface defects k of the core C1 may be deactivated by the halogen elements h, and the surface defects k of the shell S1 may be deactivated by the ligands L. The band gap of the core C1 of the first quantum dot QF may be within the band gap of the shell S1 of the first quantum dot QF. The first quantum dot QF, when having, inside its surface, a portion having a higher halogen element concentration than the surface, may be regarded as having the core C1 containing halogen elements, and the shell S1 containing no halogen elements.

The second quantum dot QS includes the core C2 containing halogen elements at a lower concentration than the core C1, the shell S2 containing no halogen elements, and the ligands L. The surface defects k of the core C2 may be deactivated by the halogen elements h, and the surface defects k of the shell S2 may be deactivated by the ligands L. The band gap of the core C2 of the second quantum dot QS may be within the band gap of the shell S2 of the second quantum dot QS. The second quantum dot QS, when having, inside its surface, a portion having a higher halogen element concentration than the surface, may be regarded as having the core C2 containing halogen elements, and the shell S2 containing no halogen elements.

In FIG. 20, the hole injection barrier is smaller, and the electron injection barrier is larger than those in the case (g2 in FIG. 6) where the concentration of halogens disposed in the shell surface does not vary in the layer thickness direction, and hence, carrier balance improves when compared with this case. In addition, the surface defects of the core C1 of the first quantum dot QF near the HTL are inert, and hence, the probability of recombination for light emission is high. Consequently, the configuration X3 illustrated in FIG. 19 offers high EQE.

Figure 21:
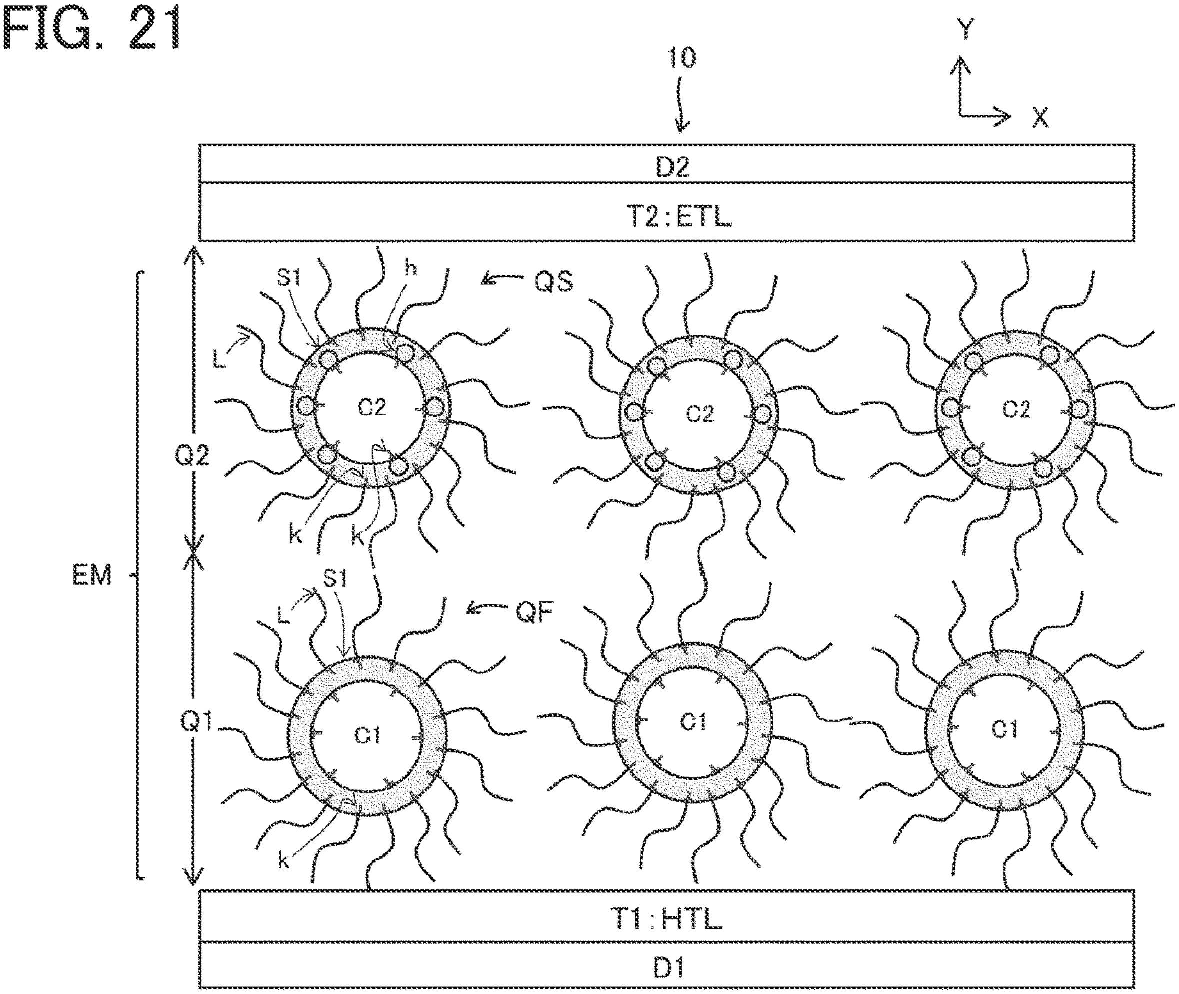
FIG. 21 is a sectional view of a configuration X4.
Figure 22:
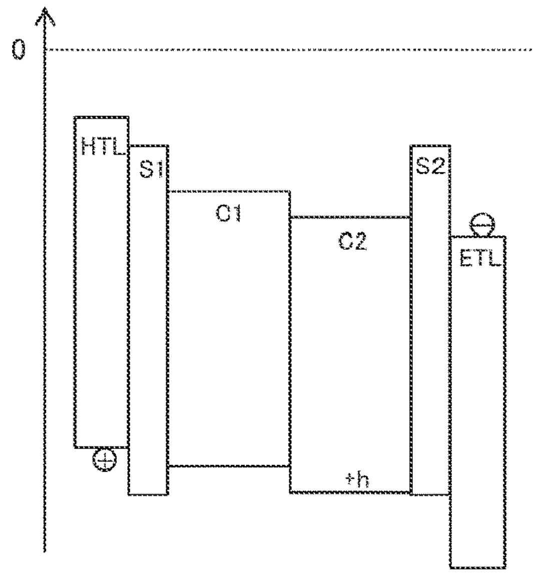
FIG. 22 is a band diagram of the light-emitting element in FIG. 21.

FIG. 21 is a sectional view of the configuration X4 in FIG. 14. FIG. 22 is a band diagram of the light-emitting element in FIG. 21. The light-emitting element 10 in FIG. 21 is structured such that the first quantum dot portion Q1 and the second quantum dot portion Q2 are formed in the stated order on the functional layer T1 (HTL), such that the first quantum dot portion Q1 contains no halogen elements, and such that the second quantum dot portion Q2 contains halogen elements at a predetermined concentration. The first quantum dot portion Q1 and the second quantum dot portion Q2 may be in the form of a layer.

The first quantum dot QF includes the core C1 containing no halogen elements, the shell S1 containing no halogen elements, and the ligands L. The surface defects k of the shell S1 may be deactivated by the ligands L. The band gap of the core C1 of the first quantum dot QF may be within the band gap of the shell S1 of the first quantum dot QF.

The second quantum dot QS includes the core C2 containing halogen elements, the shell S2 containing no halogen elements, and the ligands L. The surface defects k of the core C2 may be deactivated by the halogen elements h, and the surface defects k of the shell S2 may be deactivated by the ligands L. The band gap of the core C2 of the second quantum dot QS may be within the band gap of the shell S2 of the second quantum dot QS. The second quantum dot QS, when having, inside its surface, a portion having a higher halogen element concentration than the surface, may be regarded as having the core C2 containing halogen elements, and the shell S2 containing no halogen elements.

In FIG. 22, the hole injection barrier is smaller, and the electron injection barrier is larger than those in the case (g2 in FIG. 6) where the concentration of halogens disposed in the shell surface does not vary in the layer thickness direction, and hence, carrier balance improves when compared with this case. Consequently, the configuration X4 illustrated in FIG. 21 offers high EQE.

Figure 23:
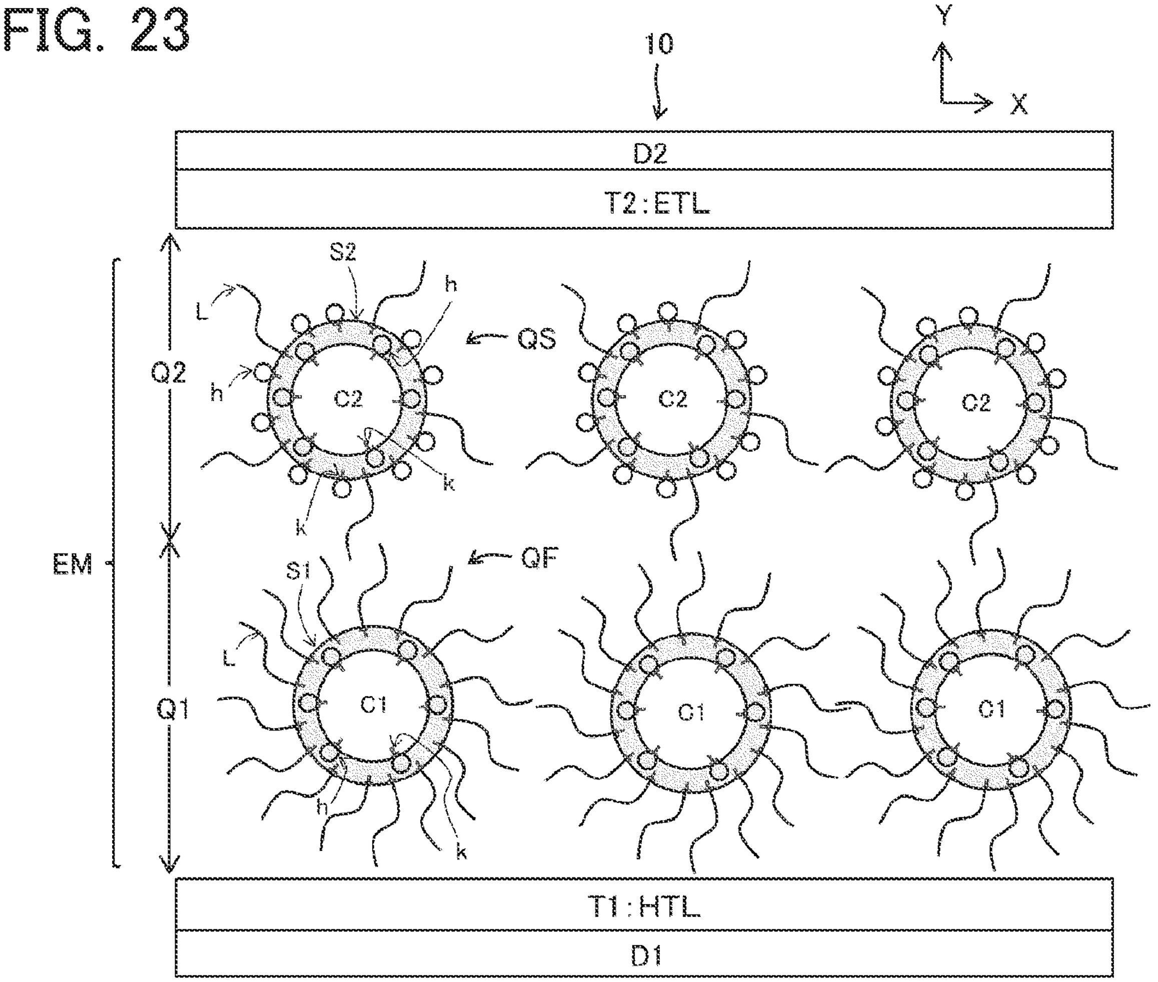
FIG. 23 is a sectional view of a configuration X5 in FIG. 14.
Figure 24:
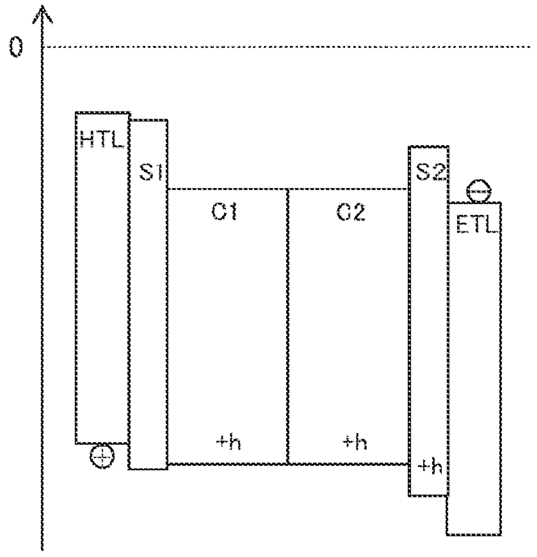
FIG. 24 is a band diagram of the light-emitting element in FIG. 23.

FIG. 23 is a sectional view of the configuration X5 in FIG. 14. FIG. 24 is a band diagram of the light-emitting element in FIG. 23. The light-emitting element 10 in FIG. 23 is structured such that the first quantum dot portion Q1 and the second quantum dot portion Q2 are formed in the stated order on the functional layer T1 (HTL), such that the second quantum dot portion Q2 contains halogen elements at a predetermined concentration, and such that the first quantum dot portion Q1 contains halogen elements at a lower concentration than the predetermined concentration. The first quantum dot portion Q1 and the second quantum dot portion Q2 may be in the form of a layer.

The first quantum dot QF includes the core C1 containing halogen elements, the shell S1 containing no halogen elements, and the ligands L. The surface defects k of the core C1 may be deactivated by the halogen elements h, and the surface defects k of the shell S1 may be deactivated by the ligands L. The band gap of the core C1 of the first quantum dot QF may be within the band gap of the shell S1 of the first quantum dot QF. The first quantum dot QF, when having, inside its surface, a portion having a higher halogen element concentration than the surface, may be regarded as having the core C1 containing halogen elements, and the shell S1 containing no halogen elements.

The second quantum dot QS includes the core C2 containing halogen elements, the shell S2 containing halogen elements, and the ligands L. The surface defects k of the core C2 may be deactivated by the halogen elements h, and the surface defects k of the shell S2 may be deactivated by the halogen elements h. The surface defects k of the shell S2 may be deactivated by the ligands L. The band gap of the core C2 of the second quantum dot QS may be within the band gap of the shell S2 of the second quantum dot QS.

In FIG. 24, the hole injection barrier is smaller, and the electron injection barrier is larger than those in the case (g2 in FIG. 6) where the concentration of halogens disposed in the shell surface does not vary in the layer thickness direction, and hence, carrier balance improves when compared with this case. In addition, the surface defects of the core C1 of the first quantum dot QF near the HTL are inert, and hence, the probability of recombination for light emission is high. Consequently, the configuration X5 illustrated in FIG. 23 offers high EQE.

Figure 25:
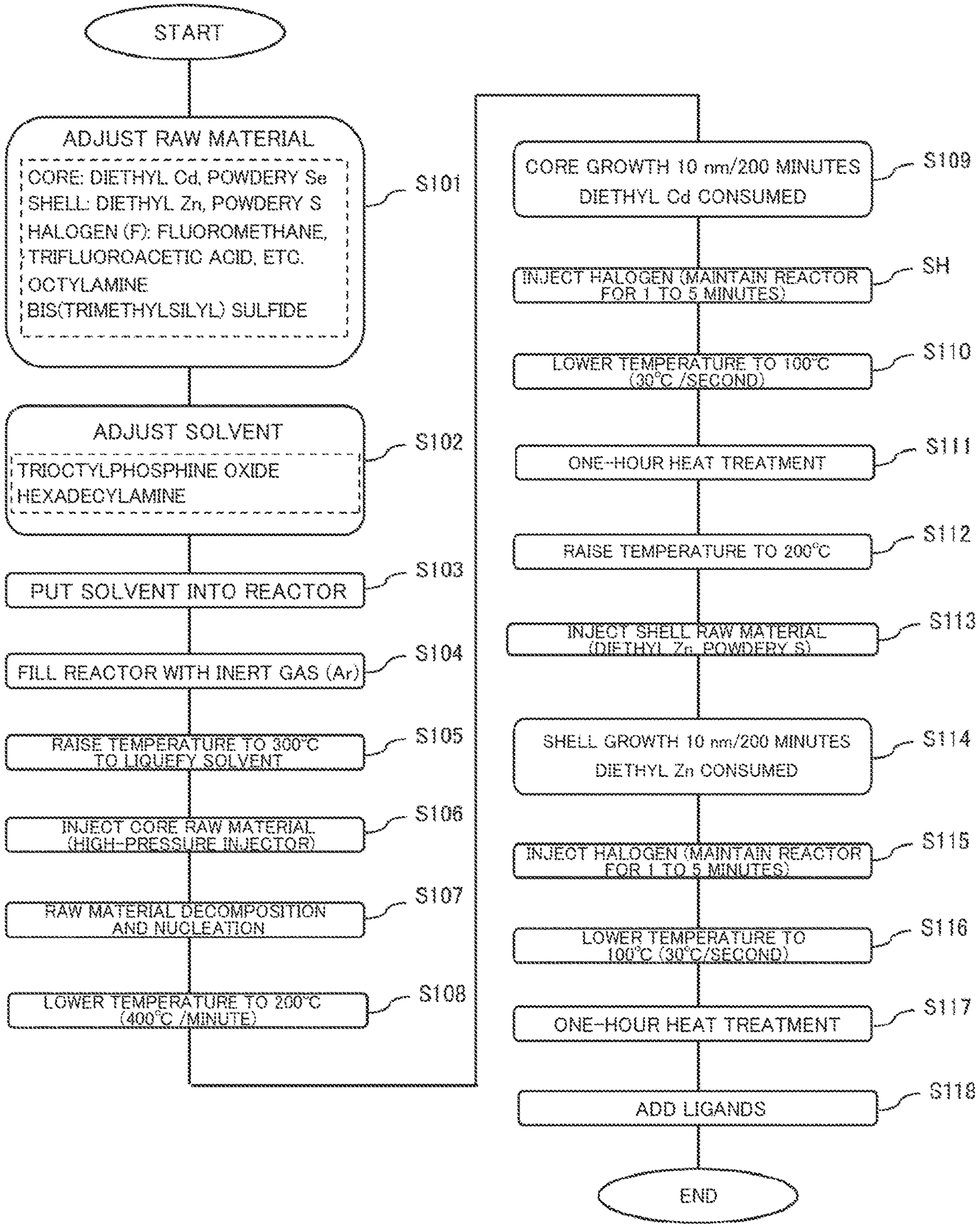
FIG. 25 is a flowchart showing a method for manufacturing a quantum dot material according to Example 2.

FIG. 25 is a flowchart showing a method for manufacturing a quantum dot material according to Example 2. In FIG. 25, Step SH is added between Step 109 and Step S110 of the manufacturing method in FIG. 8. In Step SH, a halogen element material (fluoromethane, trifluoroacetic acid, and other things) is injected into the reactor, and then the reactor is maintained for 1 to 5 minutes. The manufacturing method in FIG. 25 offers a quantum dot material containing quantum dots each having a core containing halogen elements, a shell containing halogen elements, and ligands.

Figure 26:
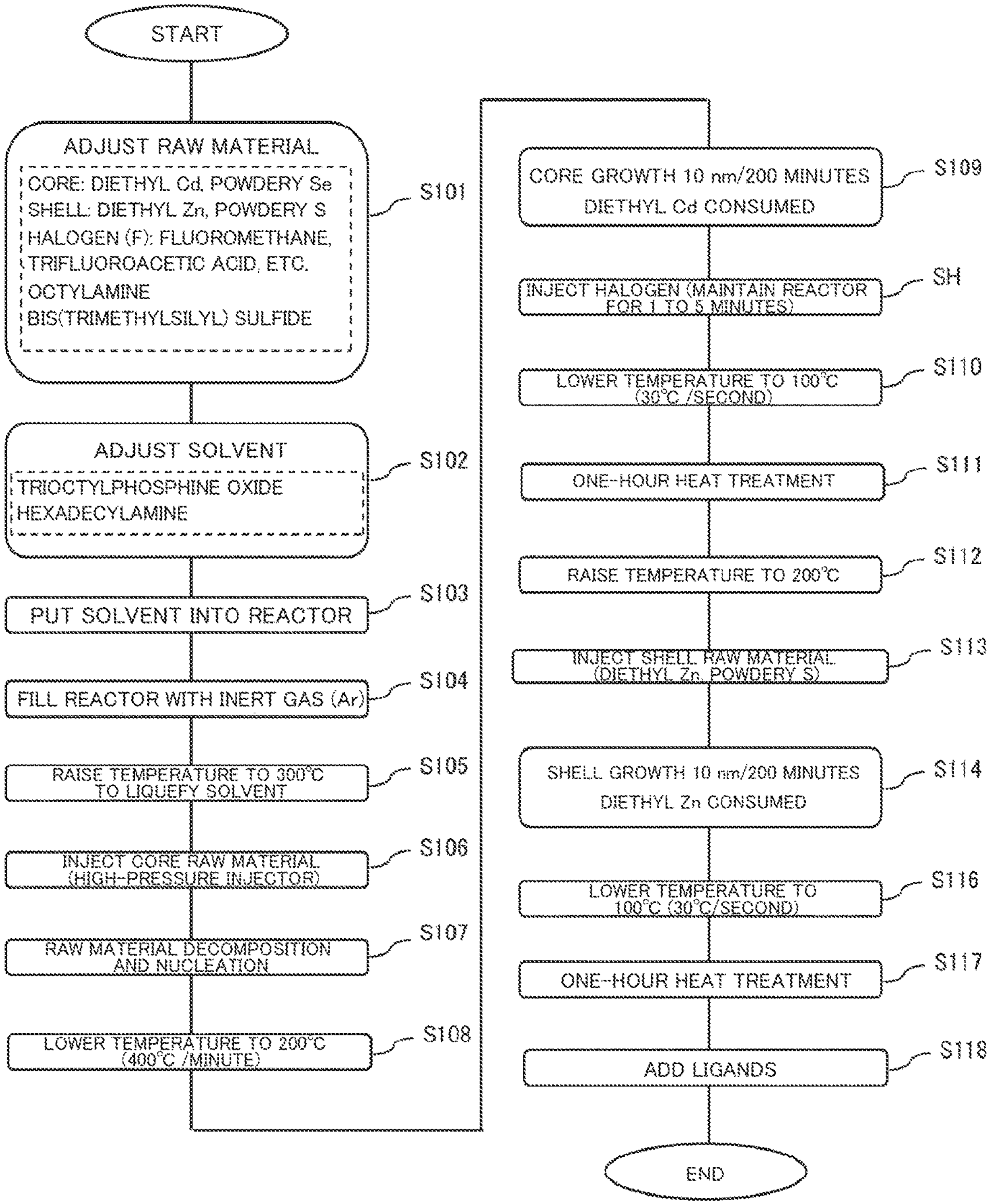
FIG. 26 is a flowchart showing a method for manufacturing the quantum dot material according to Example 2.

FIG. 26 is a flowchart showing a method for manufacturing the quantum dot material according to Example 2. In FIG. 25, Step SH is added between Step 109 and Step S110 of the manufacturing method in FIG. 8, and Step S115 in the manufacturing method in FIG. 8 is skipped (Step S115 is not performed). In Step SH, a halogen element material (fluoromethane, trifluoroacetic acid, and other things) is injected into the reactor, and then the reactor is maintained for 1 to 5 minutes. The manufacturing method in FIG. 26 offers a quantum dot material containing quantum dots each having a core containing halogen elements, a shell containing no halogen elements, and ligands.

Example 3

Figure 27:
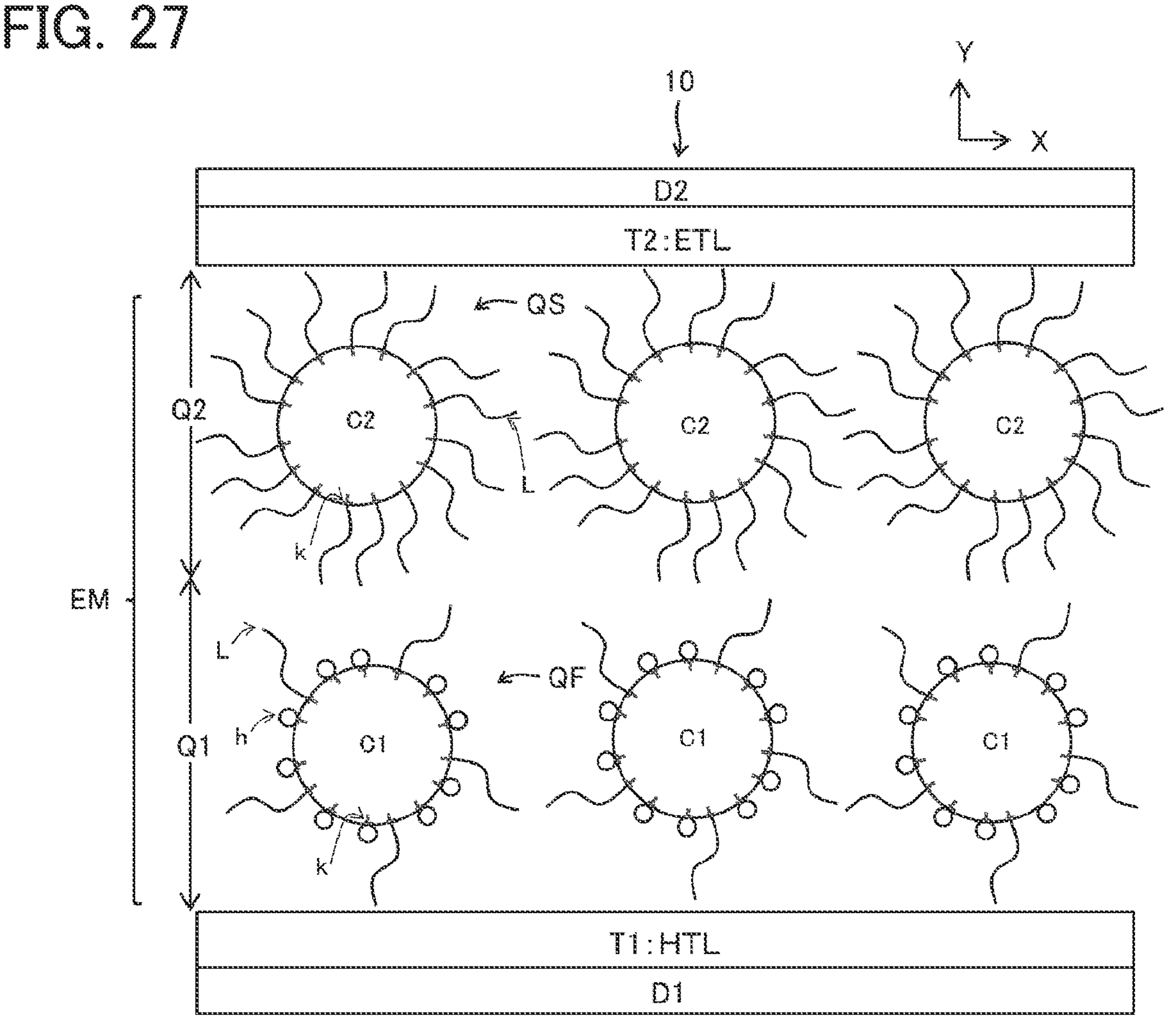
FIG. 27 is a sectional view of a configuration of a light-emitting element according to Example 3.
Figure 28:
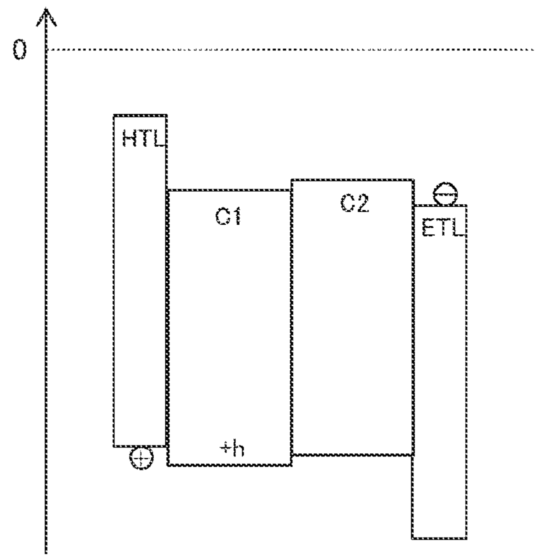
FIG. 28 is a band diagram of the light-emitting element in FIG. 27.

FIG. 27 is a sectional view of a configuration of a light-emitting element according to Example 3. FIG. 28 is a band diagram of the light-emitting element in FIG. 27. The light-emitting element 10 in FIG. 27 is structured such that the first quantum dot portion Q1 and the second quantum dot portion Q2 are formed in the stated order on the functional layer T1 (HTL), such that the first quantum dot portion Q1 contains halogen elements at a predetermined concentration, and such that the second quantum dot portion Q2 contains no halogen elements. The first quantum dot portion Q1 and the second quantum dot portion Q2 may be in the form of a layer.

The first quantum dot QF is a shell-less type and includes the core C1 containing halogen elements, and the ligands L. The surface defects k of the core C1 may be deactivated by the halogen elements h, or the surface defects k of the core C1 may be deactivated by the ligands L.

The second quantum dot QS is a shell-less type and includes the core C2 containing no halogen elements, and the ligands L. The surface defects k of the core C2 may be deactivated by the ligands L.

In FIG. 28, the hole injection barrier is smaller, and the electron injection barrier is larger than those in the case (g2 in FIG. 6) where the concentration of halogens disposed in the shell surface does not vary in the layer thickness direction, and hence, carrier balance improves when compared with this case. In addition, the surface defects of the core C1 of the first quantum dot QF near the HTL are inert, and hence, the probability of recombination for light emission is high. Consequently, the light-emitting element 10 according to Example 3 offers high EQE.

Example 4

Figure 29:
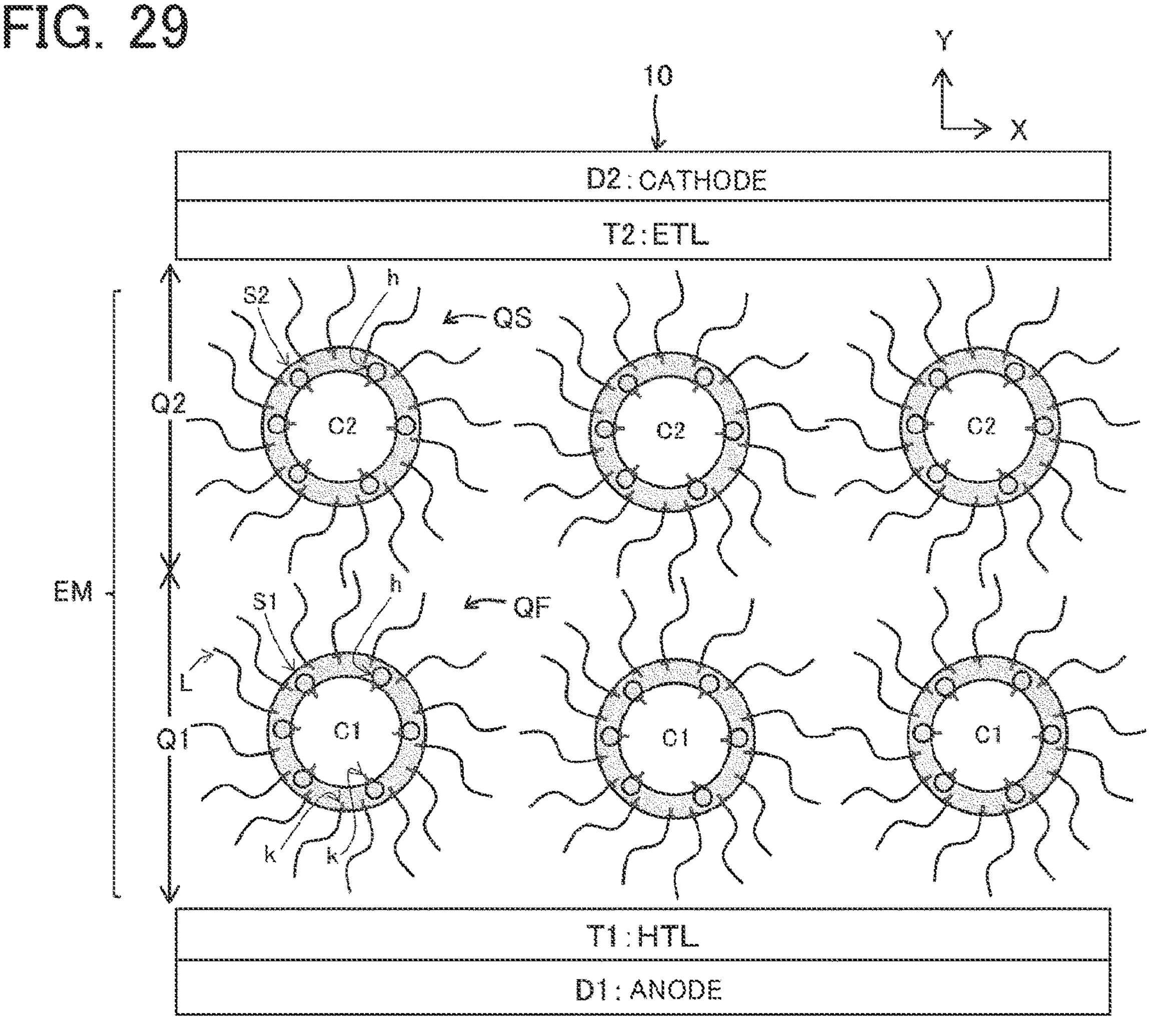
FIG. 29 is a sectional view of a configuration of a light-emitting element according to Example 4.
Figure 30:
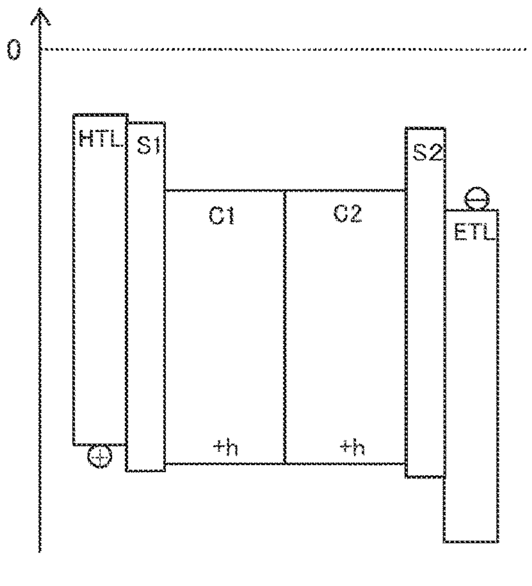
FIG. 30 is a band diagram of the light-emitting element in FIG. 29.

FIG. 29 is a sectional view of a configuration of a light-emitting element according to Example 4. FIG. 30 is a band diagram of the light-emitting element in FIG. 29. The light-emitting element 10 in FIG. 29 is structured such that the first quantum dot portion Q1 and the second quantum dot portion Q2 are formed in the stated order on the functional layer T1 (HTL), and such that the first quantum dot portion Q1 and the second quantum dot portion Q2 each contain halogen elements at a predetermined concentration. The first quantum dot portion Q1 and the second quantum dot portion Q2 may be in the form of a layer.

The first quantum dot QF includes the core C1 containing halogen elements, the shell S1 containing no halogen elements, and the ligands L. The surface defects k of the core C1 may be deactivated by the halogen elements h, and the surface defects k of the shell S1 may be deactivated by the ligands L. The band gap of the core C1 of the first quantum dot QF may be within the band gap of the shell S1 of the first quantum dot QF. The first quantum dot QF, when having, inside its surface, a portion having a higher halogen element concentration than the surface, may be regarded as having the core C1 containing halogen elements, and the shell S1 containing no halogen elements.

The second quantum dot QS includes the core C2 containing halogen elements at as high a concentration as that of the core C1, the shell S2 containing no halogen elements, and the ligands L. The surface defects k of the core C2 may be deactivated by the halogen elements h, and the surface defects k of the shell S2 may be deactivated by the ligands L. The band gap of the core C2 of the second quantum dot QS may be within the band gap of the shell S2 of the second quantum dot QS. The second quantum dot QS, when having, inside its surface, a portion having a higher halogen element concentration than the surface, may be regarded as having the core C2 containing halogen elements, and the shell S2 containing no halogen elements.

In FIG. 30, the hole injection barrier is smaller, and the electron injection barrier is larger than those in the case (g2 in FIG. 6) where the concentration of halogens disposed in the shell surface does not vary in the layer thickness direction, and hence, carrier balance improves when compared with this case. In addition, the surface defects of the core C1 of the first quantum dot QF near the HTL are inert, and hence, the probability of recombination for light emission is high. Consequently, the light-emitting element 10 according to Example 4 offers high EQE.

Second Embodiment

Figure 31:
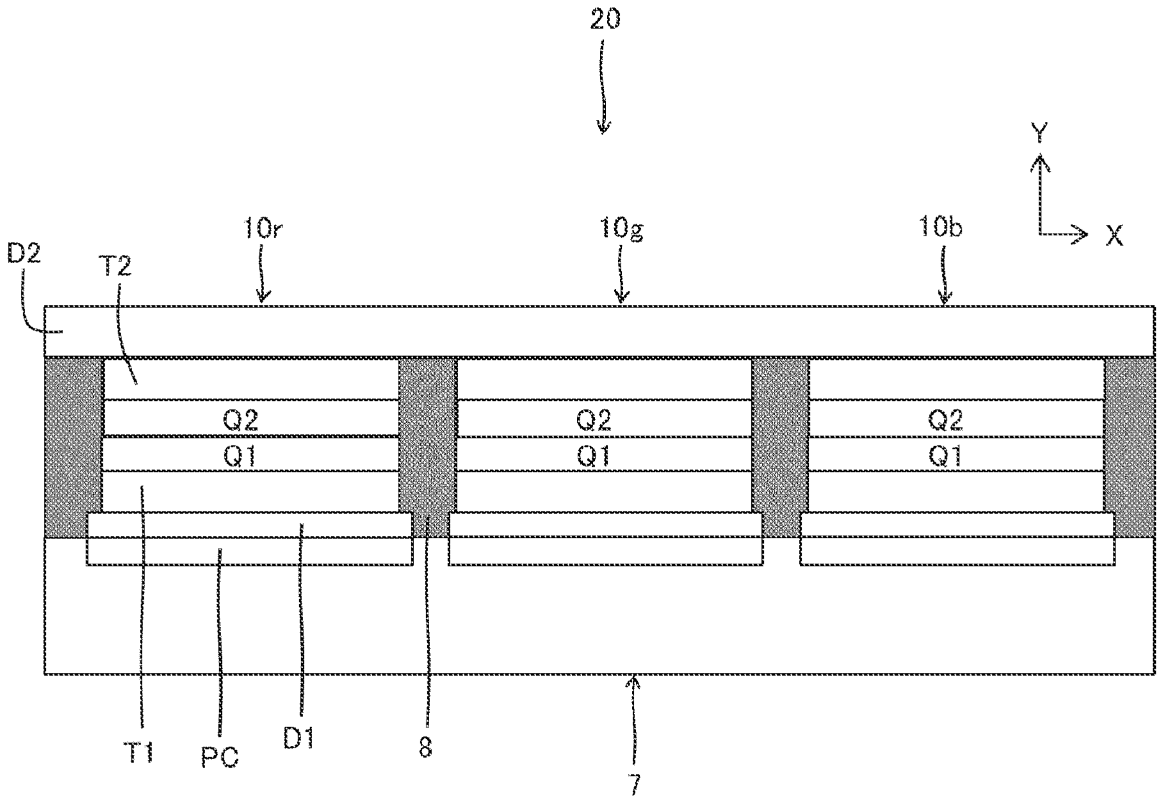
FIG. 31 is a sectional view of an example configuration of a display device according to a second embodiment.

FIG. 31 is a sectional view of an example configuration of a display device according to a second embodiment. As illustrated in FIG. 31, a display device 20 has a light-emitting element 10*r* that emits red light, a light-emitting element 10*g* that emits green light, and a light-emitting element 10*b* that emits blue light. The light-emitting elements 10*r*, 10*g*, and 10*b* are partitioned by insulating partition walls 8 formed on a driving board 7 (e.g., a pixel circuit board including TFTs). The driving board 7 is provided with pixel circuits PC corresponding to the respective light-emitting elements 10*r*, 10*g*, and 10*b*.

With regard to quantum dots QD of the light-emitting elements 10*r*, 10*g*, and 10*b*, their core particle diameters may be different, and their core materials may be different. The following relationship may be established: the band gap of the quantum dot QD of the light-emitting element 10*r* is the smallest, followed by the band gap of the quantum dot QD of the light-emitting element 10*g*, followed by the band gap of the quantum dot QD of the light-emitting element 10*b*.

The foregoing embodiments are not restrictive, but are illustrative and descriptive. It is obvious for one of ordinary skill in the art that numerous modifications can be devised based on these illustrations and descriptions.

The invention claimed is:

1. A light-emitting element comprising:

a first electrode and a second electrode; a light-emitting layer disposed between the first electrode and the second electrode; and a functional layer disposed between the light-emitting layer and the second electrode, wherein the light-emitting layer has a first quantum dot portion including a first quantum dot, and a second quantum dot portion disposed between the first quantum dot portion and the functional layer, and including a second quantum dot, one of the first quantum dot portion and the second quantum dot portion contains halogen elements at a predetermined concentration, and another of the first quantum dot portion and the second quantum dot portion contains no halogen elements or contains halogen elements at a lower concentration than the predetermined concentration, the first quantum dot has a core and a shell, and the core and the shell of the first quantum dot each contain halogen elements.

2. The light-emitting element according to claim 1, wherein the second quantum dot has a core and a shell, and the core and the shell of the second quantum dot each contain no halogen elements.

3. The light-emitting element according to claim 1, wherein the second quantum dot has a core and a shell, and the core of the second quantum dot contains halogen elements, and the shell of the second quantum dot contains no halogen elements.

4. The light-emitting element according to claim 1, wherein the second quantum dot has a core and a shell, and the core and the shell of the second quantum dot each contain halogen elements.

5. The light-emitting element according to claim 1, wherein the first quantum dot portion contains a ligand material.

6. The light-emitting element according to claim 5, wherein the ligand material includes a halogen element.

7. The light-emitting element according to claim 5, wherein the ligand material includes a metal element.

8. The light-emitting element according to claim 5, wherein the second quantum dot portion contains a ligand material, and a concentration of the ligand material in the first quantum dot portion is smaller than a concentration of the ligand material in the second quantum dot portion.

9. The light-emitting element according to claim 5, wherein the ligand material has n carbon atoms each of which bonds with a hydrogen atom, or the ligand material has n chain-shaped structures in which a different kind of element is bonded at two coordinate sites of an element with four or more pieces of coordination number, where n is a natural number, and a mass ratio of the ligand material to the first quantum dot is $5/(10\times n)$ or less.

10. The light-emitting element according to claim 9, wherein n is three or greater.

11. The light-emitting element according to claim 9, wherein the ligand material is an inorganic compound having n chain-shaped structures, an organic compound having n chain-shaped structures, or a perfluoro compound having n chain-shaped structures.

12. The light-emitting element according to claim 1, wherein the first quantum dot portion is thinner than the second quantum dot portion.

13. The light-emitting element according to claim 1, wherein the first electrode is an anode, the functional layer is an electron transport layer, and a CBM of the second quantum dot is shallower than a CBM of the first quantum dot.

14. The light-emitting element according to claim 1, wherein the halogen elements are F.

15. The light-emitting element according to claim 1 comprising an insulating layer disposed between the second quantum dot portion and the electron transport layer, wherein the first electrode is an anode, and the functional layer is an electron transport layer.

16. The light-emitting element according to claim 15, wherein the insulating layer is amorphous and contains a glass material, a tetrafluoroethylene material, or a silicone material.

17. The light-emitting element according to claim 15, wherein the insulating layer has a visible-light transmittance of 80% or greater.

18. The light-emitting element according to claim 15, wherein the insulating layer has a thickness of 5 nm or less.

19. A light-emitting element comprising:

a first electrode and a second electrode; a light-emitting layer disposed between the first electrode and the second electrode; and a functional layer disposed between the light-emitting layer and the second electrode, wherein the light-emitting layer has a first quantum dot portion including a first quantum dot, and a second quantum dot portion disposed between the first quantum dot portion and the functional layer, and including a second quantum dot, one of the first quantum dot portion and the second quantum dot portion contains halogen elements at a predetermined concentration, and another of the first quantum dot portion and the second quantum dot portion contains no halogen elements or contains halogen elements at a lower concentration than the predetermined concentration, the first quantum dot has a core and a shell, and the core of the first quantum dot contains halogen elements, and the shell of the first quantum dot contains no halogen elements.

20. A light-emitting element comprising:

a first electrode and a second electrode; a light-emitting layer disposed between the first electrode and the second electrode; and a functional layer disposed between the light-emitting layer and the second electrode, wherein the light-emitting layer has a first quantum dot portion including a first quantum dot, and a second quantum dot portion disposed between the first quantum dot portion and the functional layer, and including a second quantum dot, and one selected from the first quantum dot and the second quantum dot has a portion located inside a surface of the selected quantum dot, and having a higher halogen element concentration than the surface, the first quantum dot has a core and a shell, and the core and the shell of the first quantum dot each contain halogen elements.

* * * * *